United States Patent
Song

(10) Patent No.: US 11,875,040 B2
(45) Date of Patent: Jan. 16, 2024

(54) SEMICONDUCTOR SYSTEM FOR PERFORMING ROW HAMMERING TRACKING OPERATION

(71) Applicant: SK hynix Inc., Icheon-si (KR)

(72) Inventor: Choung Ki Song, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/951,984

(22) Filed: Sep. 23, 2022

(65) Prior Publication Data

US 2023/0376214 A1 Nov. 23, 2023

(30) Foreign Application Priority Data

May 23, 2022 (KR) .................. 10-2022-0062934

(51) Int. Cl.
*G06F 3/06* (2006.01)
*G11C 29/10* (2006.01)

(52) U.S. Cl.
CPC .......... *G06F 3/0619* (2013.01); *G06F 3/0653* (2013.01); *G06F 3/0679* (2013.01); *G11C 29/10* (2013.01)

(58) Field of Classification Search
None
See application file for complete search history.

(56) References Cited

U.S. PATENT DOCUMENTS

| 8,938,573 | B2 | 1/2015 | Greenfield et al. |
| 9,236,110 | B2* | 1/2016 | Bains ..................... G06F 3/0619 |
| 2019/0228813 | A1* | 7/2019 | Nale ................... G11C 11/40611 |
| 2019/0228815 | A1* | 7/2019 | Morohashi ........... G11C 16/349 |
| 2019/0347019 | A1* | 11/2019 | Shin ....................... G06F 3/0629 |
| 2020/0211633 | A1* | 7/2020 | Okuma ................ G06F 12/0646 |
| 2022/0188015 | A1* | 6/2022 | Kim .................... G11C 11/40611 |
| 2022/0189534 | A1* | 6/2022 | Hwang ............. G11C 11/40603 |

FOREIGN PATENT DOCUMENTS

KR 1020130115066 A 10/2013

OTHER PUBLICATIONS

B. Aichinger, "DDR memory errors caused by Row Hammer," 2015 IEEE High Performance Extreme Computing Conference (HPEC), Waltham, MA, USA, 2015, pp. 1-5, doi: 10.1109/HPEC.2015.7322462. (Year: 2015).*

* cited by examiner

*Primary Examiner* — Daniel F. McMahon
(74) *Attorney, Agent, or Firm* — William Park & Associates Ltd.

(57) ABSTRACT

A semiconductor system includes a controller configured to generate a command and an address for performing a row hammering tracking operation and performing a precharge operation on a bank on which a tracking write operation of the row hammering tracking operation has been completed and a semiconductor device including the bank and a row hammering storage circuit, the semiconductor device configured to count an active number of the bank that is stored in the row hammering storage circuit by performing a tracking read operation of the row hammering tracking operation based on the command and the address, then store, in the row hammering circuit, the active number of the bank that is counted by performing the tracking write operation of the row hammering tracking operation, and perform the precharge operation on the bank based on the command.

18 Claims, 17 Drawing Sheets

FIG. 16

| OPERATION | BANK STATUS | ACTIVE | READ | WRITE | PRECHARGE |
|---|---|---|---|---|---|
| SAME BANK | ACT | NO | tRCD | tRCD | tRAS |
| | RD | NO | tCCD | tRD to WT | tRTP + tRAS |
| | WT | NO | tWT to RD | tCCD | tWR + tRAS |
| | RH_RD | NO | tCCD | tRD to WT | NO |
| | RH_WT | NO | tWT to RD | tCCD | tWR + tRAS |
| DIFFERENT BANK | ACT | tRRD | "N" CLK | "N" CLK | "N" CLK |
| | RD | "N" CLK | tCCD | tRD to WT | "N" CLK |
| | WT | "N" CLK | tWT to RD | tCCD | "N" CLK |
| | RH_RD | NO | "N" CLK | "N" CLK | NO |
| | RH_WT | NO | "N" CLK | "N" CLK | "N" CLK |

SEMICONDUCTOR SYSTEM FOR PERFORMING ROW HAMMERING TRACKING OPERATION

CROSS-REFERENCE TO RELATED APPLICATION

The present application claims priority under 35 U.S.C. § 119(a) to Korean application number 10-2022-0062934, filed in the Korean Intellectual Property Office on May 23, 2022, the entire disclosure of which is incorporated herein by reference.

BACKGROUND

The present disclosure relates to a semiconductor system for performing a row hammering tracking operation.

A semiconductor device includes multiple memory cells for storing data. Each of the memory cells includes a cell capacitor and a cell transistor. The semiconductor device stores data in the cell capacitor through an operation of charging or discharging electric charges. The amount of charges stored in the cell capacitor ideally needs to always be constant. However, the amount of charges stored in the cell capacitor is changed due to a difference between voltages of the cell capacitor and a peripheral circuit. A change in the amount of charges stored in the cell capacitor, as described above, means that data that is stored in the cell capacitor is changed, which means that data that is stored in the cell capacitor is lost. In order to prevent a phenomenon in which data is lost, as described above, the semiconductor device performs a refresh operation.

As the degree of integration of semiconductor devices is gradually increased with improved process technology, an interval between memory cells is reduced and an interval between word lines that are connected to the respective memory cells is reduced. When the interval between the word lines is reduced, an interference effect may occur between adjacent word lines. Accordingly, data that is stored in a memory cell connected to a corresponding word line may be difficult to retain. A case in which an interference effect occurs between adjacent word lines is called a row hammering phenomenon. As the row hammering phenomenon is increased, the probability of data loss is increased.

SUMMARY

To this end, the present disclosure provides a semiconductor system, including a controller configured to generate a command and an address for performing a row hammering tracking operation and for performing a precharge operation on a bank on which a tracking write operation of the row hammering tracking operation has been completed and a semiconductor device including the bank and a row hammering storage circuit, the semiconductor device configured to count the active number of the bank that is stored in the row hammering storage circuit by performing a tracking read operation of the row hammering tracking operation based on the command and the address, then store, in the row hammering circuit, the active number of the bank that is counted by performing the tracking write operation of the row hammering tracking operation, and perform the precharge operation on the bank based on the command.

Furthermore, the present disclosure provides a semiconductor system, including a controller configured to output a command and an address for performing a row hammering tracking operation and for performing a read operation and a write operation and a semiconductor device including a bank and a row hammering storage circuit, the semiconductor device configured to count the active number of the bank that is stored in the row hammering storage circuit by performing the row hammering tracking operation based on the command and the address, store the counted active number in the row hammering storage circuit, configured to output data that is stored in the bank by performing the read operation based on the command and the address, and store the data in the bank by performing the write operation based on the command and the address.

Furthermore, the present disclosure provides a semiconductor system, including a controller configured to: generate a command and an address for performing a row hammering tracking operation, and generate the command and the address for performing a tracking write operation on a bank on which the tracking write operation of the row hammering tracking operation has not been performed based on a logic level of a flag signal when a row address that is included in the address does not have the same logic level combination or for performing a precharge operation on the bank on which the tracking write operation has been performed, and a semiconductor device including the bank and a row hammering storage circuit, the semiconductor device configured to store, in the row hammering circuit, an active number of the bank that is counted by performing the tracking write operation of the row hammering tracking operation, and perform the precharge operation on the bank based on the command.

BRIEF DESCRIPTION OF THE DRAWINGS

FIG. 16 is a table illustrating the amount of delay for generating a command in the semiconductor system according to an embodiment of the present disclosure.

DETAILED DESCRIPTION

Figure 1:
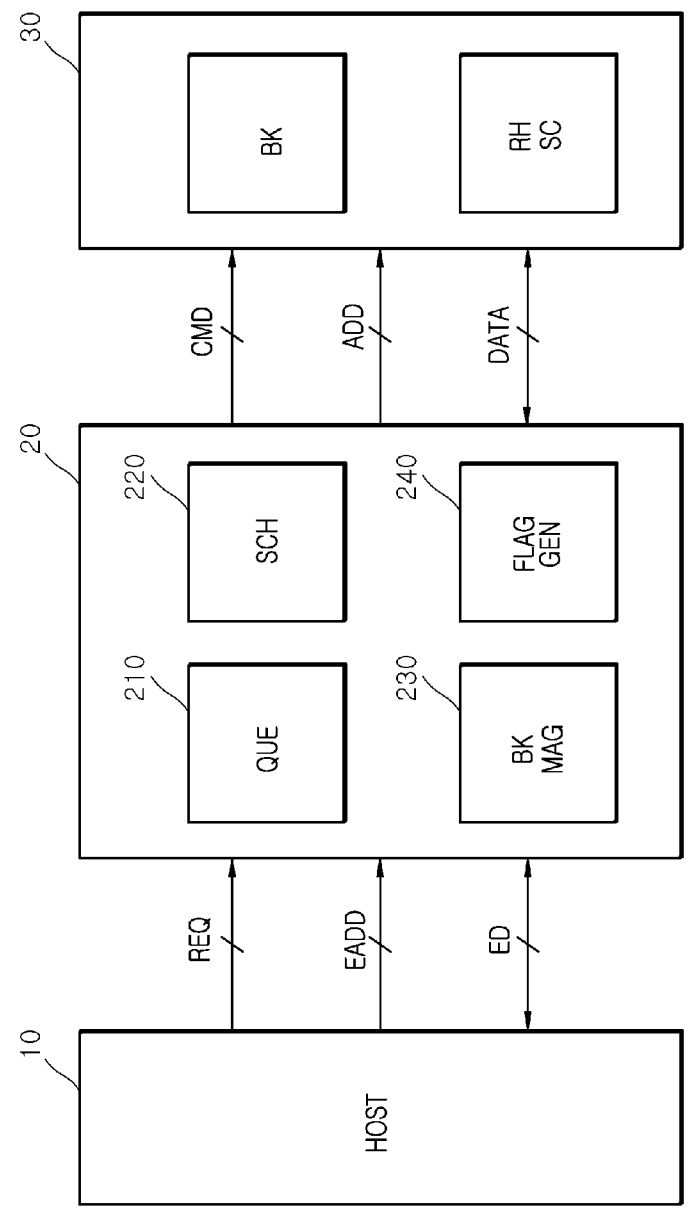
FIG. 1 illustrates a block diagram of a semiconductor system according to an embodiment of the present disclosure.

In the descriptions of the following embodiments, the term "preset" indicates that the numerical value of a parameter is previously decided, when the parameter is used in a process or algorithm. According to an embodiment, the numerical value of the parameter may be set when the process or algorithm is started or while the process or algorithm is performed.

Terms such as "first" and "second," which are used to distinguish among various components, are not limited by the components. For example, a first component may be referred to as a second component, and vice versa.

When one component is referred to as being "coupled" or "connected" to another component, it should be understood that the components may be directly coupled or connected to each other or coupled or connected to each other through another component interposed therebetween. On the other hand, when one component is referred to as being "directly coupled" or "directly connected" to another component, it should be understood that the components are directly coupled or connected to each other without another component interposed therebetween.

A "logic high level" and a "logic low level" are used to describe the logic levels of signals. A signal having "logic high level" is distinguished from a signal having "logic low level." For example, when a signal having a first voltage corresponds to a signal having a "logic high level," a signal having a second voltage may correspond to a signal having a "logic low level." According to an embodiment, a "logic high level" may be set to a voltage higher than a "logic low level." According to an embodiment, the logic levels of signals may be set to different logic levels or opposite logic levels. For example, a signal having a logic high level may be set to have a logic low level according to an embodiment, and a signal having a logic low level may be set to have a logic high level in a different embodiment.

Hereafter, the teachings of the present disclosure will be described in more detail through embodiments. The embodiments are only used to exemplify the teachings of the present disclosure, and the scope of the present disclosure is not limited by the embodiments.

The present disclosure relates to a semiconductor system that adjusts the timing at which a command for performing a normal operation and a row hammering tracking operation is generated.

Furthermore, the present disclosure relates to a semiconductor system that consecutively performs a read operation and a tracking read operation of a row hammering tracking operation, which are similar operations of outputting data that is stored therein, and consecutively performs a write operation and a tracking write operation of the row hammering tracking operation, which are similar operations of storing data therein.

Furthermore, the present disclosure relates to a semiconductor system that performs an efficient row hammering tracking operation by performing a tracking write operation when an active operation is consecutively performed on the same bank and by selectively performing a tracking write operation or a precharge operation by detecting whether a tracking write operation has been performed when active operations are consecutively performed on different banks.

According to the present disclosure, a failure attributable to a row hammering phenomenon can be effectively reduced by adjusting timing at which a command for performing a normal operation and a row hammering tracking operation is generated.

Furthermore, according to the present disclosure, an unnecessary operation time for performing different operations can be reduced by consecutively performing a read operation and a tracking read operation of a row hammering tracking operation, which are similar operations of outputting data that is stored therein, and consecutively performing a write operation and a tracking write operation of the row hammering tracking operation, which are similar operations of storing data therein.

Furthermore, according to the present disclosure, an efficient row hammering tracking operation can be performed by performing a tracking write operation when an active operation is consecutively performed on the same bank and by selectively performing a tracking write operation or a precharge operation by detecting whether a tracking write operation has been performed when active operations are consecutively performed on different banks.

As illustrated in FIG. 1, a semiconductor system 1 according to an embodiment of the present disclosure may include a host 10, a controller 20, and a semiconductor device 30.

The host 10 may output, to the controller 20, a request signal REQ for controlling an active operation, a write operation, a read operation, a row hammering tracking operation, a precharge operation, etc. The host 10 may output, to the controller 20, an external address EADD for performing an active operation, a write operation, a read operation, a row hammering tracking operation, a precharge operation, etc. The host 10 may output external data ED for performing a write operation. The host 10 may receive the external data ED after the start of a read operation. The active operation, the write operation, the read operation, the refresh operation, and the precharge operation may be set as normal operations. The active operation may be set as an operation in which a plurality of banks (BK1, BK2, BK3, BK4 in FIG. 11) included in a memory circuit (33 in FIG. 11) is enabled based on the external address EADD.

The controller 20 may include a queuing circuit (QUE) 210, a schedule control circuit (SCH) 220, a bank control circuit (BK MAG) 230, and a flag signal generation circuit (FLAG GEN) 240.

The queuing circuit 210 may store the external address EADD for performing an active operation, a write operation, a read operation, and a row hammering tracking operation. The queuing circuit 210 may output the stored external address EADD as selection addresses (SADD<1:M> in FIG. 2). The queuing circuit 210 may generate write counting signals (WCNT<1:6> in FIG. 2) that include standby information for a write operation and a tracking write operation of the row hammering tracking operation. The queuing circuit 210 may generate read counting signals (RCNT<1:6> in FIG. 2) that include standby information for a read operation and a tracking read operation of the row hammering tracking operation.

Based on the request signal REQ, the schedule control circuit 220 may generate a write read selection signal (WRS in FIG. 2) that is enabled when a tracking write operation of a row hammering tracking operation is performed. Based on the request signal REQ, the schedule control circuit 220 may generate a write input signal (WIN in FIG. 2), a write output signal (WOUT in FIG. 2), a read input signal (RIN in FIG. 2), or a read output signal (ROUT in FIG. 2) that is selectively enabled when a write operation, a read operation, or a row hammering tracking operation is performed.

The bank control circuit 230 may generate a command CMD from the request signal REQ for performing an active operation, a write operation, a read operation, a row hammering tracking operation, and a precharge operation. The bank control circuit 230 may generate an address ADD from the selection addresses (SADD<1:M> in FIG. 2) for performing an active operation, a write operation, and a read operation. Based on a flag signal (FLAG in FIG. 2) that is disabled when a tracking write operation is performed, the bank control circuit 230 may control the generation of the command CMD for performing a tracking read operation, a tracking write operation, and a precharge operation from the request signal REQ. The bank control circuit 230 may generate the address ADD from the selection addresses (SADD<1:M> in FIG. 2) for performing an active operation, a write operation, a read operation, and a row hammering tracking operation.

The flag signal generation circuit 240 may generate the flag signal (FLAG in FIG. 2) that is disabled when the command CMD for performing a tracking write operation is input and may generate the flag signal (FLAG in FIG. 2) that is enabled when the command CMD for performing a tracking read operation is input.

The controller 20 may generate the command CMD based on the request signal REQ for controlling an active operation, a write operation, a read operation, a row hammering tracking operation, a precharge operation, etc. The controller 20 may generate the address ADD based on the external address EADD for performing an active operation, a write operation, a read operation, a row hammering tracking operation, and a precharge operation. The controller 20 may generate data DATA from the external data ED for performing a write operation and may output the data DATA. After the start of a read operation, the controller 20 may generate the external data ED from the data DATA and output the external data ED.

The semiconductor device 30 may include a bank BK and a row hammering storage circuit RHSC.

The bank BK may store the data DATA at a location that is selected by the address ADD during a write operation after an active operation. The bank BK may output the data DATA that is stored at a location that is selected by the address ADD during a read operation after the active operation. The semiconductor device 30 may be implemented to include multiple banks.

The row hammering storage circuit RHSC may store the active number of a bank BK in an active operation. The active number of a bank BK may be The row hammering storage circuit RHSC may output the active number of the bank BK that is stored after the start of a tracking read operation of a row hammering tracking operation and may up-count the output active number of the bank BK once. The row hammering storage circuit RHSC may store the active number of the bank BK that has been up-counted once after the start of a tracking write operation of the row hammering tracking operation. The row hammering storage circuit RHSC may reset the active number of the bank BK that has been stored after the start of a refresh operation. The semiconductor device 30 may be implemented to include multiple row hammering storage circuits RHSC. The active number may be set to the number of times the bank BK is enabled.

The semiconductor device 30 may store the data DATA after the start of a write operation based on the command CMD and the address ADD. Based on the command CMD and the address ADD, the semiconductor device 30 may output the data DATA that has been stored after the start of a read operation. After counting the active number of a bank BK that has been stored in the row hammering storage circuit RHSC by performing a tracking read operation of a row hammering tracking operation based on the command CMD and the address ADD, the semiconductor device 30 may store, in the row hammering storage circuit RHSC, the active number of the bank BK that is counted by performing a tracking write operation of the row hammering tracking operation. The semiconductor device 30 may perform a precharge operation on the bank BK based on the command CMD and the address ADD.

Figure 2:
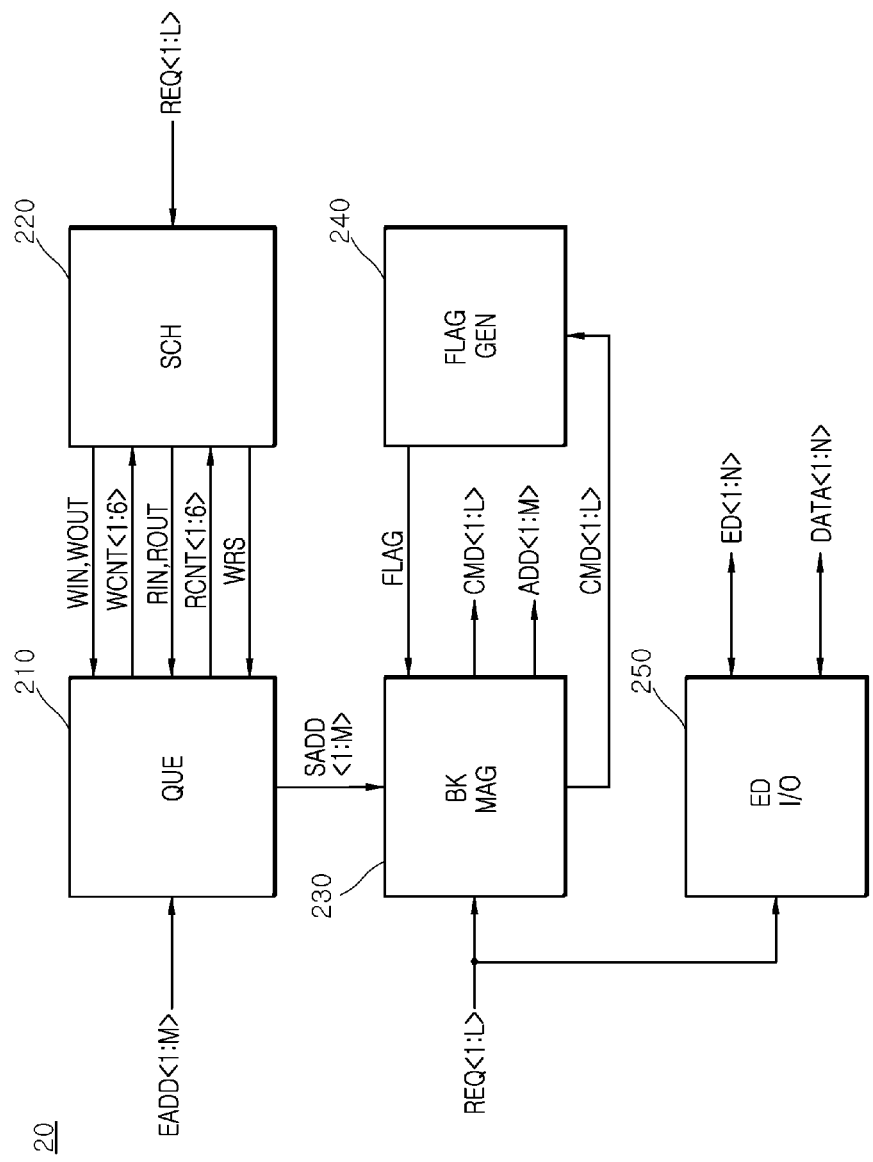
FIG. 2 illustrates a block diagram according to an embodiment of a controller included in the semiconductor system, illustrated in FIG. 1.

FIG. 2 illustrates a block diagram according to an embodiment of the controller 20. As illustrated in FIG. 2, the controller 20 may include the queuing circuit 210, the schedule control circuit 220, the bank control circuit 230, the flag signal generation circuit 240, and an external data input and output circuit (ED I/O) 250.

The queuing circuit 210 may sequentially store first to M-th external addresses EADD<1:M> for performing an active operation, a write operation, a read operation, and a row hammering tracking operation. The queuing circuit 210 may output the stored first to M-th external addresses EADD<1:M> as first to M-th selection addresses SADD<1:M>. The queuing circuit 210 may generate first to sixth write counting signals WCNT<1:6> that include standby information for the write operation and a tracking write operation of the row hammering tracking operation. The queuing circuit 210 may generate the first to sixth write counting signals WCNT<1:6> that are up-counted by the write input signal WIN that is received when the write operation and the tracking write operation of the row hammering tracking operation are performed. The queuing circuit 210 may generate the first to sixth write counting signals WCNT<1:6> that are down-counted by the write output signal WOUT that is received after the write operation and the tracking write operation of the row hammering tracking operation are performed. The queuing circuit 210 may generate first to sixth read counting signals RCNT<1:6> that include standby information for the read operation and a tracking read operation of the row hammering tracking operation. The queuing circuit 210 may generate the first to sixth read counting signals RCNT<1:6> that are up-counted by the read input signal RIN that is received when the read operation and the tracking read operation of the row hammering tracking operation are performed. The queuing circuit 210 may generate the first to sixth read counting signals RCNT<1:6> that are down-counted by the read output signal ROUT that is received after the read operation and the tracking read operation of the row hammering tracking operation are performed. The "M" number of bits of the first to M-th external addresses EADD<1:M> may be variously set in different embodiments. "M" may be a natural number.

Based on first to L-th request signals REQ<1:L>, the schedule control circuit 220 may generate the write read selection signal WRS that is enabled when a write operation and a tracking write operation of a row hammering tracking operation are performed. The "L" number of bits of the first to L-th request signals REQ<1:L> may be variously set in different embodiments. "L" may be a natural number.

The schedule control circuit 220 may generate the write input signal WIN that is enabled when the first to L-th request signals REQ<1:L> are received as a logic level combination for performing a write operation and a tracking write operation and when the first to sixth write counting signals WCNT<1:6> are counted as a set number or less. For example, the schedule control circuit 220 may generate the write input signal WIN that is enabled when the first to L-th request signals REQ<1:L> are received as a logic level combination for performing a write operation and a tracking write operation and when the first to sixth write counting signals WCNT<1:6> are counted as 50 times or less. A case in which the first to sixth write counting signals WCNT<1:6> are counted as 50 times may be set as a case in which the write operation and the tracking write operation are performed as 80% or less of a maximum of 64 times. The schedule control circuit 220 may generate the write output signal WOUT that is enabled after the first to L-th request signals REQ<1:L> are received as a logic level combination for performing a write operation and after a tracking write operation and the write operation and the tracking write operation are performed. The schedule control circuit 220 may generate the read input signal RIN, which is enabled instead of the write input signal WIN, when the first to L-th request signals REQ<1:L> are received as a logic level combination for performing a write operation and a tracking write operation and the first to sixth read counting signals RCNT<1:6> are counted as more than a preset number. After generating the read input signal RIN, which is enabled instead of the write input signal WIN, the schedule control circuit 220 may generate the read output signal ROUT.

The schedule control circuit 220 may generate the read input signal RIN that is enabled when the first to L-th request signals REQ<1:L> are received as a logic level combination for performing a read operation and a tracking read operation and when the first to sixth read counting signals RCNT<1:6> are counted as a set number or less. For example, the schedule control circuit 220 may generate the read input signal RIN that is enabled when the first to L-th request signals REQ<1:L> are received as a logic level combination for performing a write operation and a tracking write operation and when the first to sixth read counting signals RCNT<1:6> are counted as 50 times or less. A case in which the first to sixth read counting signals RCNT<1:6> are counted as 50 times may be set as a case in which the read operation and the tracking read operation are performed as 80% or less of a maximum of 64 times. The schedule control circuit 220 may generate the read output signal ROUT that is enabled after the first to L-th request signals REQ<1:L> are received as the logic level combination for performing the write operation and the tracking write operation and after the read operation and the tracking read operation are performed. The schedule control circuit 220 may generate the write input signal WIN, which is enabled instead of the read input signal RIN, when the first to L-th request signals REQ<1:L> are received as the logic level combination for performing the read operation and the tracking read operation and when the first to sixth write counting signals WCNT<1:6> are counted as more than a preset number. The schedule control circuit 220 may generate the write output signal WOUT after generating the write input signal WIN, which is enabled instead of the read input signal RIN.

The bank control circuit 230 may generate first to L-th commands CMD<1:L> from the first to L-th request signals REQ<1:L> for performing an active operation, a write operation, a read operation, a row hammering tracking operation, and a precharge operation. The bank control circuit 230 may generate first to M-th addresses ADD<1:M> from the first to M-th selection addresses SADD<1:M> for performing an active operation, a write operation, a read operation, a row hammering tracking operation, and a precharge operation. Based on the flag signal FLAG that is disabled when the tracking write operation is performed, the bank control circuit 230 may block the generation of the first to L-th commands CMD<1:L> for performing a tracking write operation from the first to L-th request signals REQ<1:L>. Based on the flag signal FLAG that is disabled when a tracking write operation is performed, the bank control circuit 230 may generate the first to L-th commands CMD<1:L> for performing a precharge operation from the first to L-th request signals REQ<1:L>. The bank control circuit 230 may generate the first to M-th addresses ADD<1:M> from the first to M-th selection addresses SADD<1:M> for performing an active operation, a write operation, a read operation, a row hammering tracking operation, and a precharge operation. The first to L-th commands CMD<1:L> may include the same "L" number of bits as the first to L-th request signals REQ<1:L>. "L" may be a natural number. The first to M-th addresses ADD<1:M> may include the same "M" number of bits as the first to M-th external addresses EADD<1:M>. "M" may be a natural number.

The flag signal generation circuit 240 may generate the flag signal FLAG that is disabled when a tracking write operation is completed after receiving the first to L-th commands CMD<1:L> for performing the tracking write operation. The flag signal generation circuit 240 may generate the flag signal FLAG that is enabled when receiving the first to L-th commands CMD<1:L> for performing a tracking read operation.

When the first to L-th request signals REQ<1:L> have a logic level combination for performing a write operation, the external data input and output circuit 250 may generate first to N-th data DATA<1:N> from first to N-th external data ED<1:N> and may output the first to N-th data DATA<1:N> to the semiconductor device 30. When the first to L-th request signals REQ<1:L> have a logic level combination for performing a read operation, the external data input and output circuit 250 may generate the first to N-th external data ED<1:N> from the first to N-th data DATA<1:N> and output the first to N-th external data ED<1:N> to the host 10. The first to N-th external data ED<1:N> and the first to N-th data DATA<1:N> may include the "N" number of bits. "N" may be a natural number.

Figure 3:
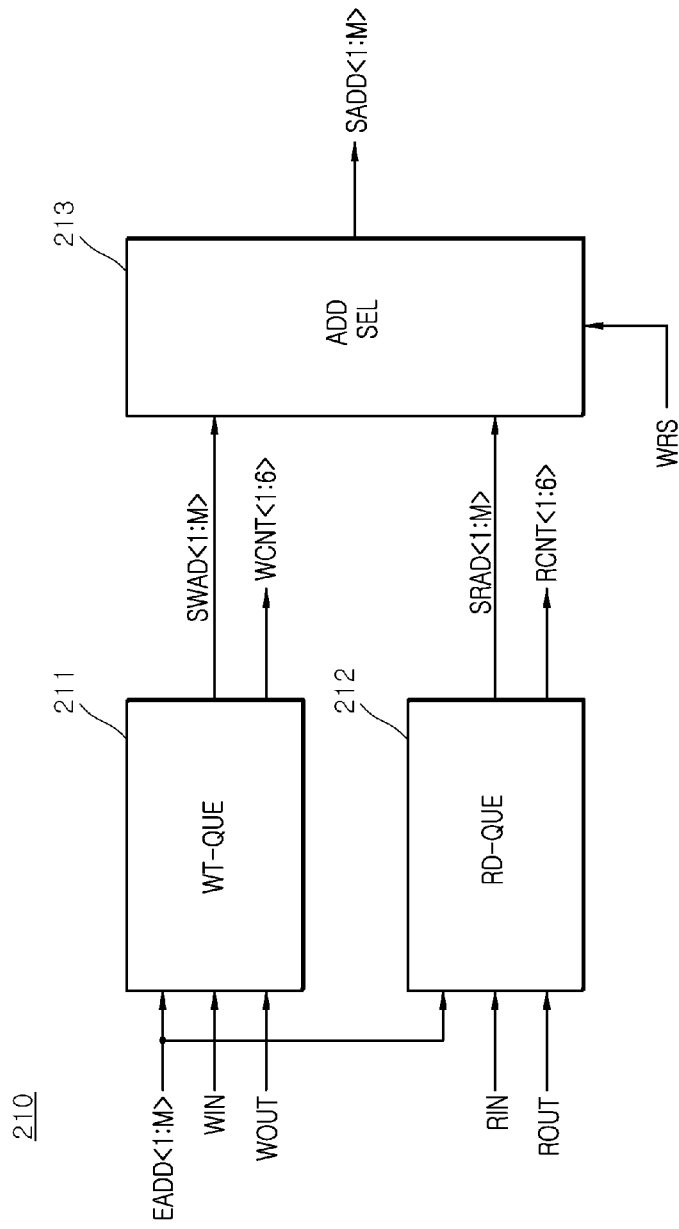
FIG. 3 illustrates a block diagram according to an embodiment of a queuing circuit included in the controller, illustrated in FIG. 2.

FIG. 3 illustrates a block diagram according to an embodiment of the queuing circuit 210 included in a controller illustrated in FIG. 2. As illustrated in FIG. 3, the queuing circuit 210 may include a write queuing circuit (WT-QUE) 211, a read queuing circuit (RD-QUE) 212, and an address selection circuit (ADD SEL) 213.

The write queuing circuit 211 may sequentially store the first to M-th external addresses EADD<1:M> for performing an active operation, a write operation, and a tracking write operation. The write queuing circuit 211 may output the stored first to M-th external addresses EADD<1:M> as first to M-th write selection addresses SWAD<1:M>. The write queuing circuit 211 may generate the first to sixth write counting signals WCNT<1:6> that include standby information for the write operation and the tracking write operation. The write queuing circuit 211 may generate the first to sixth write counting signals WCNT<1:6> that are up-counted by the write input signal WIN that is received when the write operation and the tracking write operation are performed. The write queuing circuit 211 may generate the first to sixth write counting signals WCNT<1:6> that are down-counted by the write output signal WOUT that is received after the write operation and the tracking write operation are performed. The first to M-th write selection addresses SWAD<1:M> may include the same "M" number of bits as the first to M-th external addresses EADD<1:M>. "M" may be a natural number.

The read queuing circuit 212 may sequentially store the first to M-th external addresses EADD<1:M> for performing an active operation, a read operation, and a tracking read operation. The read queuing circuit 212 may output the stored first to M-th external addresses EADD<1:M> as first to M-th read selection addresses SRAD<1:M>. The read queuing circuit 212 may generate the first to sixth read counting signals RCNT<1:6> that include standby information for the read operation and the tracking read operation. The read queuing circuit 212 may generate the first to sixth read counting signals RCNT<1:6> that are up-counted by the read input signal RIN that is received when the read operation and the tracking read operation are performed. The read queuing circuit 212 may generate the first to sixth read counting signals RCNT<1:6> that are down-counted by the read output signal ROUT that is received after the read operation and the tracking read operation are performed. The first to M-th read selection addresses SRAD<1:M> may include the same "M" number of bits as the first to M-th external addresses EADD<1:M>. "M" may be a natural number.

The address selection circuit 213 may generate the first to M-th selection addresses SADD<1:M> from one of the first to M-th write selection addresses SWAD<1:M> and the first to M-th read selection addresses SRAD<1:M> based on a logic level of the write read selection signal WRS. The address selection circuit 213 may output the first to M-th write selection addresses SWAD<1:M> as the first to M-th selection addresses SADD<1:M> in response to the write read selection signal WRS that is enabled when a tracking write operation of a row hammering tracking operation is performed. The address selection circuit 213 may output the first to M-th read selection addresses SRAD<1:M> as the first to M-th selection addresses SADD<1:M> in response to the write read selection signal WRS that is disabled when the tracking write operation of the row hammering tracking operation is performed. The first to M-th selection addresses SADD<1:M> may include the same "M" number of bits as the first to M-th external addresses EADD<1:M>. "M" may be a natural number.

Figure 4:
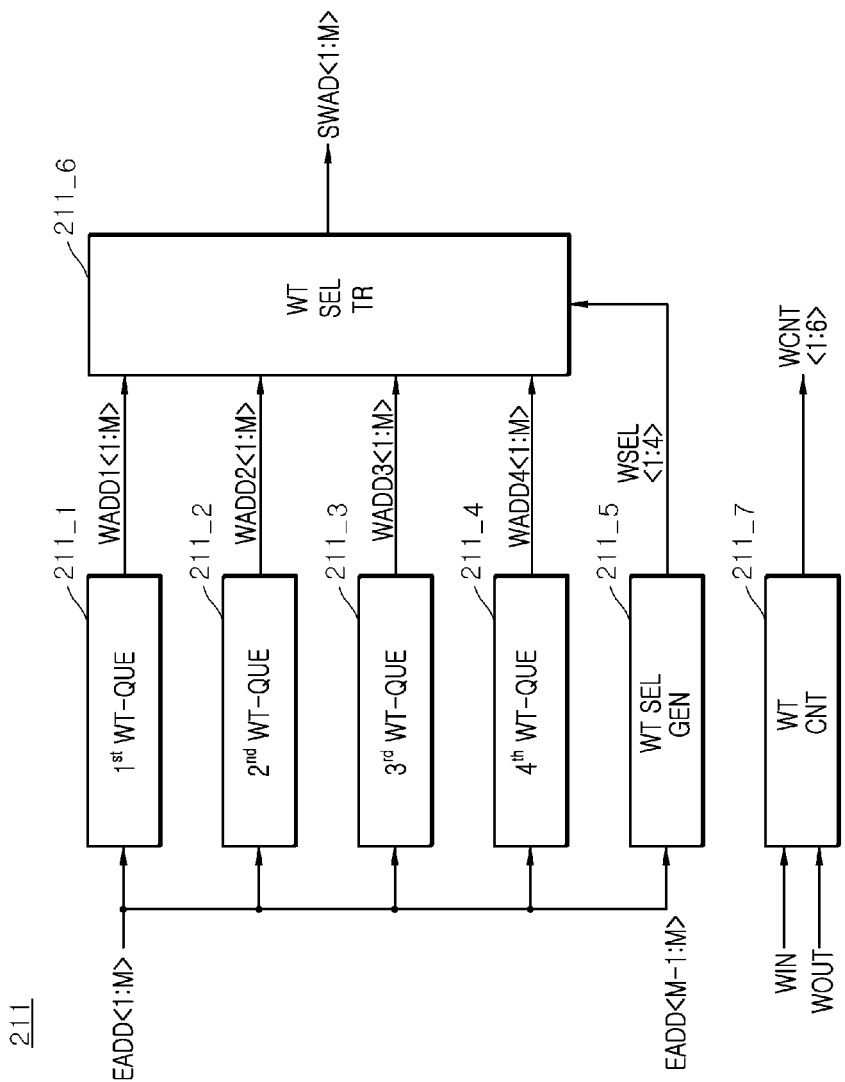
FIG. 4 illustrates a block diagram according to an embodiment of a write queuing circuit included in the queuing circuit, illustrated in FIG. 3.

FIG. 4 illustrates a block diagram according to an embodiment of the write queuing circuit 211. As illustrated in FIG. 4, the write queuing circuit 211 may include a first write queuing circuit (1$^{st}$ WT-QUE) 211_1, a second write queuing circuit (2$^{nd}$ WT-QUE) 211_2, a third write queuing circuit (3$^{rd}$ WT-QUE) 211_3, a fourth write queuing circuit (4$^{th}$ WT-QUE) 211_4, a write selection signal generation circuit (WT SEL GEN) 211_5, a write selection transfer circuit (WT SEL TR) 211_6, and a write counter (WT CNT) 211_7.

The first write queuing circuit 211_1 may store the first to M-th external addresses EADD<1:M> for performing an active operation, a write operation, and a tracking write operation. The first write queuing circuit 211_1 may store the first to M-th external addresses EADD<1:M> that are received for the first time in order to perform the active operation, the write operation, and the tracking write operation. The first write queuing circuit 211_1 may output the stored first to M-th external addresses EADD<1:M> as first write addresses WADD1<1:M>. The first write queuing circuit 211_1 may store the first to M-th external addresses EADD<1:M> for performing another active operation, another write operation, and another tracking write operation after outputting the first write addresses WADD1<1:M>. The first write addresses WADD1<1:M> may include the same "M" number of bits as the first to M-th external addresses EADD<1:M>. "M" may be a natural number.

The second write queuing circuit 211_2 may store the first to M-th external addresses EADD<1:M> for performing an active operation, a write operation, and a tracking write operation. The second write queuing circuit 211_2 may store the first to M-th external addresses EADD<1:M> that are received for the second time in order to perform the active operation, the write operation, and the tracking write operation. The second write queuing circuit 211_2 may output the stored first to M-th external addresses EADD<1:M> as second write addresses WADD2<1:M>. The second write queuing circuit 211_2 may store the first to M-th external addresses EADD<1:M> for performing another active operation, another write operation, and another tracking write operation after outputting the second write addresses WADD2<1:M>. The second write addresses WADD2<1:M> may include the same "M" number of bits as the first to M-th external addresses EADD<1:M>. "M" may be a natural number.

The third write queuing circuit 211_3 may store the first to M-th external addresses EADD<1:M> for performing an active operation, a write operation, and a tracking write operation. The third write queuing circuit 211_3 may store the first to M-th external addresses EADD<1:M> that are received for the third time in order to perform the active operation, the write operation, and the tracking write operation. The third write queuing circuit 211_3 may output the stored first to M-th external addresses EADD<1:M> as third write addresses WADD3<1:M>. The third write queuing circuit 211_3 may store the first to M-th external addresses EADD<1:M> for performing another active operation, another write operation, and another tracking write operation after outputting the third write addresses WADD3<1:M>. The third write addresses WADD3<1:M> may include the same "M" number of bits as the first to M-th external addresses EADD<1:M>. "M" may be a natural number.

The fourth write queuing circuit 211_4 may store the first to M-th external addresses EADD<1:M> for performing an active operation, a write operation, and a tracking write operation. The fourth write queuing circuit 211_4 may store the first to M-th external addresses EADD<1:M> that are received for the fourth time in order to perform the active operation, the write operation, and the tracking write operation. The fourth write queuing circuit 211_4 may output the stored first to M-th external addresses EADD<1:M> as fourth write addresses WADD4<1:M>. The fourth write queuing circuit 211_4 may store the first to M-th external addresses EADD<1:M> for performing another active operation, another write operation, and another tracking write operation after outputting the fourth write addresses WADD4<1:M>. The fourth write addresses WADD4<1:M> may include the same "M" number of bits as the first to M-th external addresses EADD<1:M>. "M" may be a natural number.

The write selection signal generation circuit 211_5 may generate first to fourth write selection signals WSEL<1:4> that are selectively enabled by decoding (M−1)-th and M-th external addresses EADD<M−1:M>. The (M−1)-th and M-th external addresses EADD<M−1:M> may be set as a signal for setting an output sequence INDEX of the first to M-th external addresses EADD<1:M> that are stored in the first write queuing circuit 211_1, the second write queuing circuit 211_2, the third write queuing circuit 211_3, and the fourth write queuing circuit 211_4. For example, the write selection signal generation circuit 211_5 may generate the first write selection signal WSEL<1> that is enabled to a logic high level when the (M−1)-th external address EADD<M−1> is received as a logic low level and the M-th external address EADD<M> is received as a logic low level. The write selection signal generation circuit 211_5 may generate the second write selection signal WSEL<2> that is enabled to a logic high level when the (M−1)-th external address EADD<M−1> is received as a logic high level and the M-th external address EADD<M> is received as a logic low level.

The write selection transfer circuit 211_6 may output one of the first write addresses WADD1<1:M>, the second write addresses WADD2<1:M>, the third write addresses WADD3<1:M>, and the fourth write addresses WADD4<1:M> as the first to M-th write selection addresses SWAD<1:M> based on a logic level combination of the first to fourth write selection signals WSEL<1:4>. For example, the write selection transfer circuit 211_6 may output the first write addresses WADD1<1:M> as the first to M-th write selection addresses SWAD<1:M> when the first write selection signal WSEL<1> is enabled to a logic high level.

The write counter 211_7 may generate the first to sixth write counting signals WCNT<1:6> that are up-counted by the write input signal WIN that is received when a write operation and a tracking write operation are performed. The write counter 211_7 may generate the first to sixth write counting signals WCNT<1:6> that are down-counted by the write output signal WOUT that is received after a write operation and a tracking write operation are performed.

Figure 5:
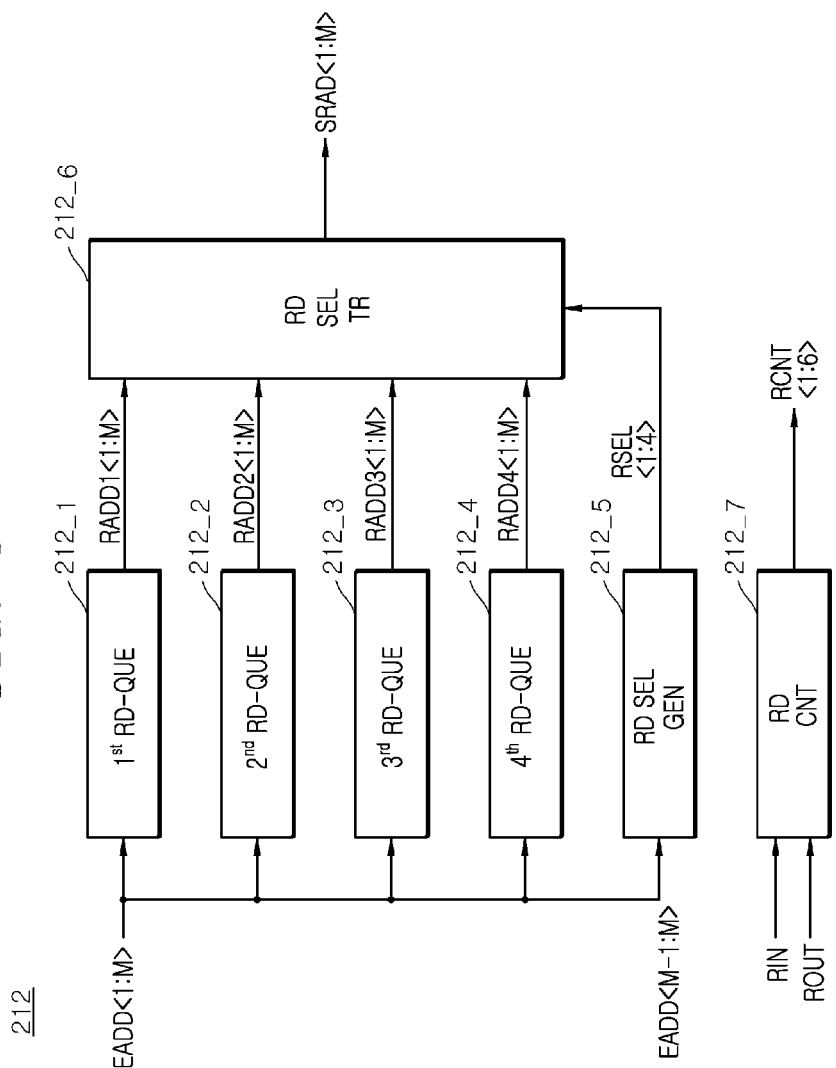
FIG. 5 illustrates a block diagram according to an embodiment of a read queuing circuit included in the queuing circuit, illustrated in FIG. 3.

FIG. 5 illustrates a block diagram according to an embodiment of the read queuing circuit 212. As illustrated in FIG. 5, the read queuing circuit 212 may include a first read queuing circuit (1st RD-QUE) 212_1, a second read queuing circuit (2nd RD-QUE) 212_2, a third read queuing circuit (3rd RD-QUE) 212_3, a fourth read queuing circuit (4th RD-QUE) 212_4, a read selection signal generation circuit (RD SEL GEN) 212_5, a read selection transfer circuit (RD SEL TR) 212_6, and a read counter (RD CNT) 212_7.

The first read queuing circuit 212_1 may store the first to M-th external addresses EADD<1:M> for performing an active operation, a read operation, and a tracking read operation. The first read queuing circuit 212_1 may store the first to M-th external addresses EADD<1:M> that are received for the first time in order to perform the active operation, the read operation, and the tracking read operation. The first read queuing circuit 212_1 may output the stored first to M-th external addresses EADD<1:M> as first read addresses RADD1<1:M>. The first read queuing circuit 212_1 may store the first to M-th external addresses EADD<1:M> for performing another active operation, another read operation, and another tracking read operation after outputting the first read addresses RADD1<1:M>. The first read addresses RADD1<1:M> may include the same "M" number of bits as the first to M-th external addresses EADD<1:M>. "M" may be a natural number.

The second read queuing circuit 212_2 may store the first to M-th external addresses EADD<1:M> for performing an active operation, a read operation, and a tracking read operation. The second read queuing circuit 212_2 may store the first to M-th external addresses EADD<1:M> that are received for the second time in order to perform the active operation, the read operation, and the tracking read operation. The second read queuing circuit 212_2 may output the stored first to M-th external addresses EADD<1:M> as second read addresses RADD2<1:M>. The second read queuing circuit 212_2 may store the first to M-th external addresses EADD<1:M> for performing another active operation, another read operation, and another tracking read operation after outputting the second read addresses RADD2<1:M>. The second read addresses RADD2<1:M> may include the same "M" number of bits as the first to M-th external addresses EADD<1:M>. "M" may be a natural number.

The third read queuing circuit 212_3 may store the first to M-th external addresses EADD<1:M> for performing an active operation, a read operation, and a tracking read operation. The third read queuing circuit 212_3 may store the first to M-th external addresses EADD<1:M> that are received for the third time in order to perform the active operation, the read operation, and the tracking read operation. The third read queuing circuit 212_3 may output the stored first to M-th external addresses EADD<1:M> as third read addresses RADD3<1:M>. The third read queuing circuit 212_3 may store the first to M-th external addresses EADD<1:M> for performing another active operation, another read operation, and another tracking read operation after outputting the third read addresses RADD3<1:M>. The third read addresses RADD3<1:M> may include the same "M" number of bits as the first to M-th external addresses EADD<1:M>. "M" may be a natural number.

The fourth read queuing circuit 212_4 may store the first to M-th external addresses EADD<1:M> for performing an active operation, a read operation, and a tracking read operation. The fourth read queuing circuit 212_4 may store the first to M-th external addresses EADD<1:M> that are received for the fourth time in order to perform the active operation, the read operation, and the tracking read operation. The fourth read queuing circuit 212_4 may output the stored first to M-th external addresses EADD<1:M> as fourth read addresses RADD4<1:M>. The fourth read queuing circuit 212_4 may store the first to M-th external addresses EADD<1:M> for performing another active operation, another read operation, and another tracking read operation after outputting the fourth read addresses RADD4<1:M>. The fourth read addresses RADD4<1:M> may include the same "M" number of bits as the first to M-th external addresses EADD<1:M>. "M" may be a natural number.

The read selection signal generation circuit 212_5 may generate first to fourth read selection signals RSEL<1:4> that are selectively enabled by decoding (M−1)-th and M-th external addresses EADD<M−1:M>. The (M−1)-th and M-th external addresses EADD<M−1:M> may be set as a signal for setting an output sequence INDEX of the first to M-th external addresses EADD<1:M> that are stored in the first read queuing circuit 212_1, the second read queuing circuit 212_2, the third read queuing circuit 212_3, and the fourth read queuing circuit 212_4. For example, the read selection signal generation circuit 212_5 may generate the first read selection signal RSEL<1> that is enabled to a logic high level when the (M−1)-th external address EADD<M−1> is received as a logic low level and the M-th external address EADD<M> is received as a logic low level. The read selection signal generation circuit 212_5 may generate the second read selection signal RSEL<2> that is enabled to a logic high level when the (M−1)-th external address EADD<M−1> is received as a logic high level and the M-th external address EADD<M> is received as a logic low level.

The read selection transfer circuit 212_6 may output one of the first read addresses RADD1<1:M>, the second read addresses RADD2<1:M>, the third read addresses RADD3<1:M>, and the fourth read addresses RADD4<1:M> as the first to M-th read selection addresses SRAD<1:

M> based on a logic level combination of the first to fourth read selection signals RSEL<1:4>. For example, the read selection transfer circuit 212_6 may output the first read addresses RADD1<1:M> as the first to M-th read selection addresses SRAD<1:M> when the first read selection signal RSEL<1> is enabled to a logic high level.

The read counter 212_7 may generate the first to sixth read counting signals RCNT<1:6> that are up-counted by the read input signal RIN that is received when a read operation and a tracking read operation are performed. The read counter 212_7 may generate the first to sixth read counting signals RCNT<1:6> that are down-counted by the read output signal ROUT that is received after the read operation and the tracking read operation are performed.

Figure 6:
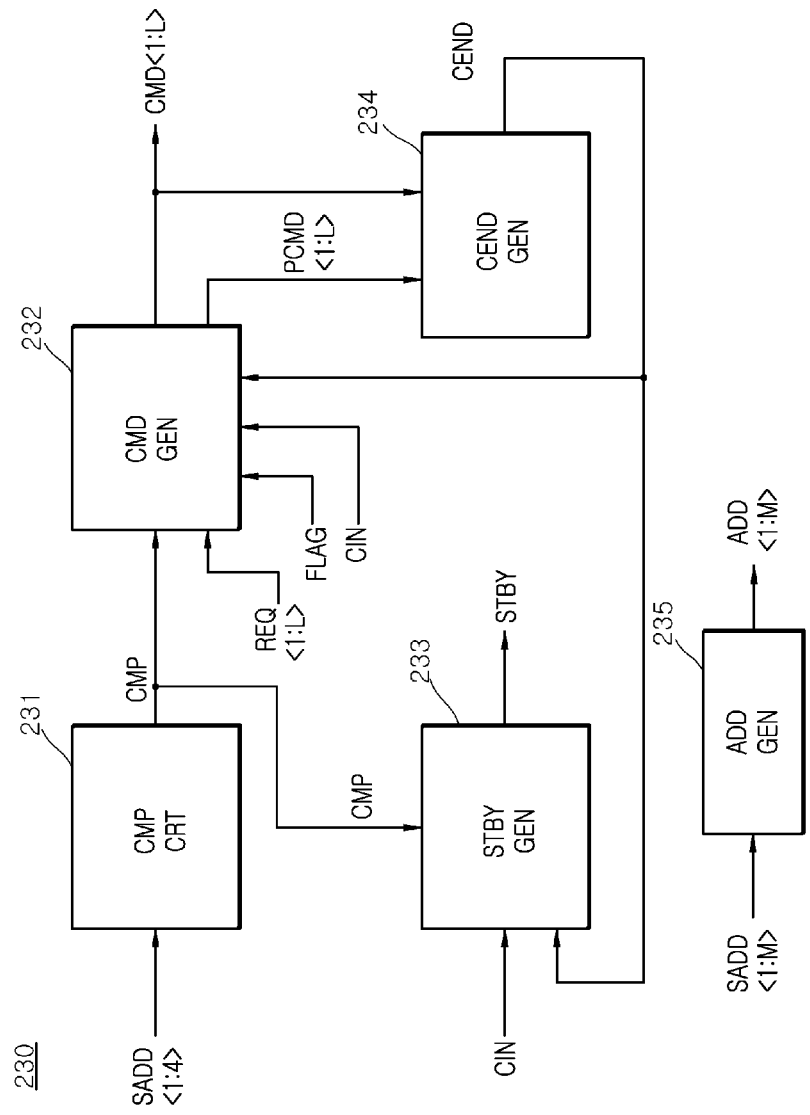
FIG. 6 illustrates a block diagram according to an embodiment of a bank control circuit included in the controller, illustrated in FIG. 2.

FIG. 6 illustrates a block diagram according to an embodiment of the bank control circuit 230. As illustrated in FIG. 6, the bank control circuit 230 may include a comparison circuit (CMP CRT) 231, a command generation circuit (CMD GEN) 232, a standby signal generation circuit (STBY GEN) 233, a command end signal generation circuit (CEND GEN) 234, and an address generation circuit (ADD GEN) 235.

The comparison circuit 231 may generate a comparison signal CMP that is enabled when the first to fourth selection addresses SADD<1:4> are identically received. The comparison circuit 231 may generate the comparison signal CMP that is enabled when the first to fourth selection addresses SADD<1:4> that were previously received and the first to fourth selection addresses SADD<1:4> that are currently received are identical with each other. The first to fourth selection addresses SADD<1:4> may be set as a row address, among the first to M-th selection addresses SADD<1:M>. The first to fourth selection addresses SADD<1:4> may be set as a signal for activating first to fourth banks BK1 to BK4 illustrated in FIGS. 11 and 12.

Based on the flag signal FLAG, a command input signal CIN, a command end signal CEND, and the comparison signal CMP, the command generation circuit 232 may generate first to L-th pre-commands PCMD<1:L> and the first to L-th commands CMD<1:L> that are sequentially generated by delaying the first to L-th request signals REQ<1:L>. Based on the flag signal FLAG, the command input signal CIN, the command end signal CEND, and the comparison signal CMP, the command generation circuit 232 may generate the first to L-th pre-commands PCMD<1:L> and the first to L-th commands CMD<1:L> that are sequentially generated by delaying the first to L-th request signals REQ<1:L> in order to perform an active operation, a write operation, a read operation, a row hammering tracking operation, and a precharge operation. The amount of delay that the first to L-th request signals REQ<1:L> are delayed in order to perform the active operation, the write operation, the read operation, the row hammering tracking operation, and the precharge operation will be specifically described with reference to FIG. 16 to be described below. The command input signal CIN may be set as a signal that includes a pulse that is generated whenever the first to L-th request signals REQ<1:L> are received. The first to L-th pre-commands PCMD<1:L> may include the same "L" number of bits as the first to L-th commands CMD<1:L>. "L" may be a natural number.

The standby signal generation circuit 233 may generate a standby signal STBY that is enabled when repeatedly receiving the command input signal CIN when the comparison signal CMP is enabled and may generate a standby signal STBY that is disabled when receiving the command end signal CEND. The standby signal generation circuit 233 may generate the standby signal STBY that is enabled when repeatedly receiving the command input signal CIN three times when the comparison signal CMP is enabled and may generate the standby signal STBY that is disabled when receiving the command end signal CEND. A case in which the command input signal CIN is repeatedly received three times may be set as a case (RHC) in which the command generation circuit 232 is implemented as in FIGS. 8 and 9 and a tracking read operation and a tracking write operation are consecutively performed in response to the input of the first to L-th request signals REQ<1:L>. The standby signal generation circuit 233 may generate the standby signal STBY that is enabled when repeatedly receiving the command input signal CIN four times when the comparison signal CMP is enabled and may generate the standby signal STBY that is disabled when receiving the command end signal CEND. A case in which the command input signal CIN is repeatedly received four times may be set as a case in which the command generation circuit 232 is implemented as in FIG. 10 and a tracking read operation RH_RD and a tracking write operation RH_WT are separately performed in response to the input of the first to L-th request signals REQ<1:L>.

The command end signal generation circuit 234 may generate the command end signal CEND that is enabled when receiving the first to L-th pre-commands PCMD<1:L>. The command end signal generation circuit 234 may generate the command end signal CEND that is disabled when the first to L-th commands CMD<1:L> are output.

The address generation circuit 235 may generate the first to M-th addresses ADD<1:M> based on the first to M-th selection addresses SADD<1:M>. The address generation circuit 235 may output, as the first to M-th addresses ADD<1:M>, the first to M-th selection addresses SADD<1:M> for performing an active operation, a write operation, a read operation, a row hammering tracking operation, a precharge operation, etc.

Figure 7:
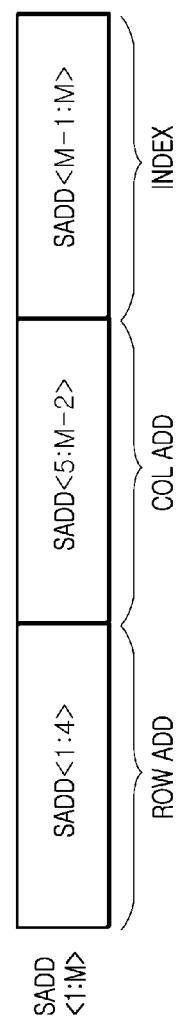
FIG. 7 is a diagram for describing a selection address according to an embodiment of the present disclosure.

FIG. 7 is a diagram for describing the first to M-th selection addresses SADD<1: M>.

The first to fourth selection addresses SADD<1:4>, among the first to M-th selection addresses SADD<1:M>, may be set as a row address ROW ADD for activating the first to fourth banks BK1 to BK4 and activating a row path that is included in each of the first to fourth banks BK1 to BK4.

The fifth to (M−2) selection addresses SADD<5:M−2>, among the first to M-th selection addresses SADD<1:M>, may be set as a column address COL ADD for activating a column path that is included in each of the first to fourth banks BK1 to BK4.

The (M−1)-th and M-th selection addresses SADD<M−1:M>, among the first to M-th selection addresses SADD<1:M>, may be set as a signal for setting an output sequence INDEX of the first to M-th external addresses EADD<1:M> that are stored in the first write queuing circuit 211_1, the second write queuing circuit 211_2, the third write queuing circuit 211_3, and the fourth write queuing circuit 211_4, illustrated in FIG. 4.

The (M−1)-th and M-th selection addresses SADD<M−1:M>, among the first to M-th selection addresses SADD<1:M>, may be set as a signal for setting an output sequence INDEX of the first to M-th external addresses EADD<1:M> that are stored in the first read queuing circuit 212_1, the second read queuing circuit 212_2, the third read queuing circuit 212_3, and the fourth read queuing circuit 212_4, illustrated in FIG. 5.

Bits for setting the row address ROW ADD, the column address COL ADD, and the output sequence INDEX that are included in the first to M-th selection addresses SADD<1:M> may be variously set in different embodiments.

Figure 8:
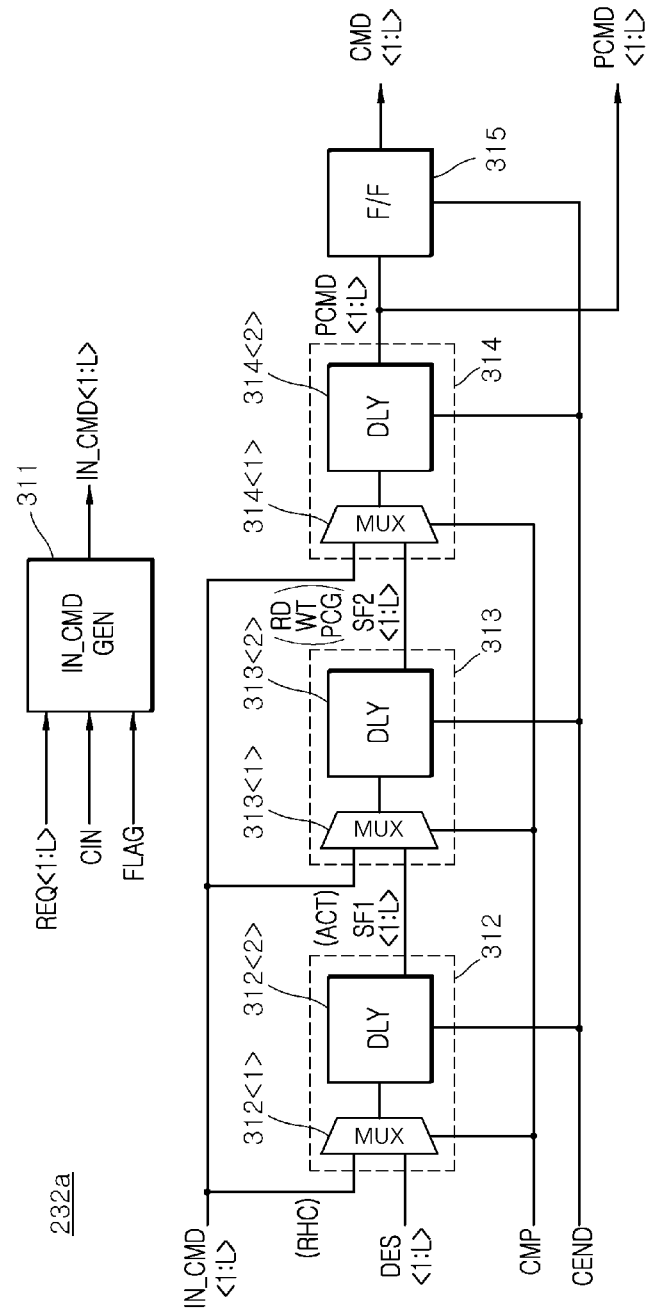
FIGS. 8 to 10 are diagrams illustrating a construction according to an embodiment of a command generation circuit included in the bank control circuit, illustrated in FIG. 6.

FIG. 8 illustrates a block diagram according to an embodiment of a command generation circuit 232a. As illustrated in FIG. 8, the command generation circuit 232a may include an input command generation circuit (IN_CMD GEN) 311, a first command shifting circuit 312, a second command shifting circuit 313, a third command shifting circuit 314, and a command output circuit (F/F) 315.

When the command input signal CIN is enabled, the input command generation circuit 311 may generate first to L-th input commands IN_CMD<1:L> based on the first to L-th request signals REQ<1:L>. When the command input signal CIN is enabled, the input command generation circuit 311 may output the first to L-th request signals REQ<1:L> as the first to L-th input commands IN_CMD<1:L>. When the flag signal FLAG is disabled, the input command generation circuit 311 may block the input of the first to L-th request signals REQ<1:L> for performing a tracking write operation.

When the comparison signal CMP is disabled, the first command shifting circuit 312 may be implemented as a multiplexer (MUX) 312<1> and a delay circuit (DLY) 312<2>. The multiplexer 312<1> may output first to L-th deselection signals DES<1:L>. When the comparison signal CMP is enabled, the multiplexer 312<1> may output the first to L-th input commands IN_CMD<1:L>. In this case, the first to L-th input commands IN_CMD<1:L> may be set as a logic level combination for consecutively (RHC) performing a tracking read operation and a tracking write operation. When the command end signal CEND is enabled, the delay circuit 312<2> may output an output signal of the multiplexer 312<1> as first shifting commands SF1<1:L> by delaying the output signal by the amount of delay. The amount of delay of the delay circuit 312<2> may be variously set in different embodiments. The first to L-th deselection signals DES<1:L> may be set as an operation of not selecting the first to fourth banks BK1 to BK4, illustrated in FIGS. 11 and 12.

The second command shifting circuit 313 may be implemented as a multiplexer (MUX) 313<1> and a delay circuit (DLY) 313<2>. When the comparison signal CMP is disabled, the multiplexer 313<1> may output the first shifting commands SF1<1:L>. When the comparison signal CMP is enabled, the multiplexer 313<1> may output the first to L-th input commands IN_CMD<1:L>. In this case, the first to L-th input commands IN_CMD<1:L> may be set as a logic level combination for performing an active operation ACT. When the command end signal CEND is enabled, the delay circuit 313<2> may output an output signal of the multiplexer 313<1> as second shifting commands SF2<1:L> by delaying the output signal by the amount of delay. The amount of delay of the delay circuit 313<2> may be variously set in different embodiments.

The third command shifting circuit 314 may be implemented as a multiplexer (MUX) 314<1> and a delay circuit (DLY) 314<2>. The multiplexer 314<1> may output the second shifting commands SF2<1:L> when the comparison signal CMP is disabled. The multiplexer 314<1> may output the first to L-th input commands IN_CMD<1:L> when the comparison signal CMP is enabled. In this case, the first to L-th input commands IN_CMD<1:L> may be set as a logic level combination for performing one of a read operation RD, a write operation WT, and a precharge operation PCG. When the command end signal CEND is enabled, the delay circuit 314<2> may output an output signal of the multiplexer 314<1> as the first to L-th pre-commands PCMD<1:L> by delaying the output signal by the amount of delay. The amount of delay of the delay circuit 314<2> may be variously set in different embodiments. When the command end signal CEND is enabled, the command output circuit 315 may generate the first to L-th commands CMD<1:L> based on the first to L-th pre-commands PCMD<1:L>. When the command end signal CEND is enabled, the command output circuit 315 may output the first to L-th pre-commands PCMD<1:L> as the first to L-th commands CMD<1:L>.

The command generation circuit 232a, illustrated in FIG. 8, may be implemented to perform the active operation ACT after consecutively (RHC) performing a tracking read operation and a tracking write operation and to perform one of the read operation RD, the write operation WT, and the precharge operation PCG after performing the active operation ACT. It is preferred that an operation of consecutively (RHC) performing the tracking read operation and the tracking write operation is performed before the precharge operation PCG is performed.

The amount of delay of each of the delay circuits 312<2>, 313<2>, and 314<2>, illustrated in FIG. 8, may be set as the amount of delay, illustrated in FIG. 16.

Figure 9:
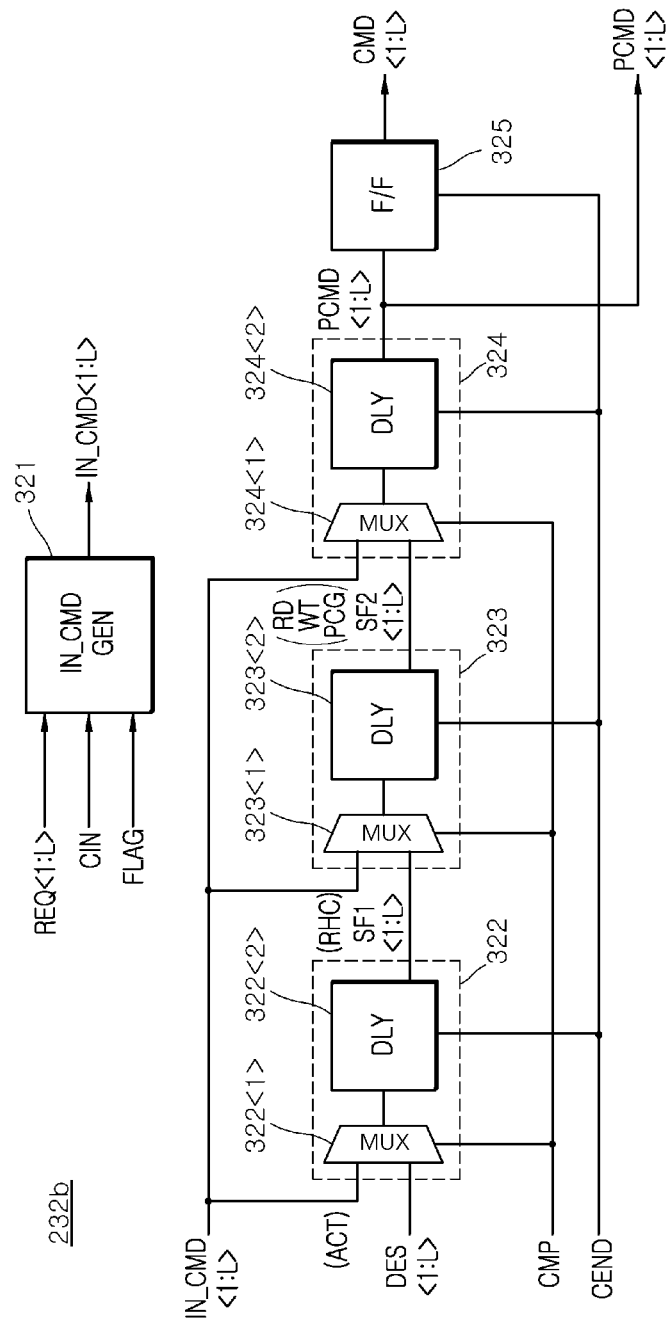

FIG. 9 illustrates a block diagram according to another embodiment of a command generation circuit 232b. As illustrated in FIG. 9, the command generation circuit 232b may include an input command generation circuit (IN_CMD GEN) 321, a first command shifting circuit 322, a second command shifting circuit 323, a third command shifting circuit 324, and a command output circuit (F/F) 325.

When the command input signal CIN is enabled, the input command generation circuit 321 may generate the first to L-th input commands IN_CMD<1:L> based on the first to L-th request signals REQ<1:L>. When the command input signal CIN is enabled, the input command generation circuit 321 may output the first to L-th request signals REQ<1:L> as the first to L-th input commands IN_CMD<1:L>. When the flag signal FLAG is disabled, the input command generation circuit 321 may block the input of the first to L-th request signals REQ<1:L> for performing a tracking write operation.

The first command shifting circuit 322 may be implemented as a multiplexer (MUX) 322<1> and a delay circuit (DLY) 322<2>. The multiplexer 322<1> may output first to L-th deselection signals DES<1:L> when the comparison signal CMP is disabled. The multiplexer 322<1> may output the first to L-th input commands IN_CMD<1:L> when the comparison signal CMP is enabled. In this case, the first to L-th input commands IN_CMD<1:L> may be set as a logic level combination for performing an active operation ACT. When the command end signal CEND is enabled, the delay circuit 322<2> may output an output signal of the multiplexer 322<1> as first shifting commands SF1<1:L> by delaying the output signal by the amount of delay. The amount of delay of the delay circuit 322<2> may be variously set in different embodiments. The first to L-th deselection signals DES<1:L> may be set as an operation of not selecting the first to fourth banks BK1 to BK4, illustrated in FIGS. 11 and 12.

The second command shifting circuit 323 may be implemented as a multiplexer (MUX) 323<1> and a delay circuit (DLY) 323<2>. The multiplexer 323<1> may output the first shifting commands SF1<1:L> when the comparison signal CMP is disabled. The multiplexer 323<1> may output the first to L-th input commands IN_CMD<1:L> when the comparison signal CMP is enabled. In this case, the first to L-th input commands IN_CMD<1:L> may be set as a logic level combination for consecutively (RHC) performing a tracking read operation and a tracking write operation. When the command end signal CEND is enabled, the delay circuit 323<2> may output an output signal of the multiplexer 323<1> as second shifting commands SF2<1:L> by delaying the output signal by the amount of delay. The amount of delay of the delay circuit 323<2> may be variously set in different embodiments.

The third command shifting circuit 324 may be implemented as a multiplexer (MUX) 324<1> and a delay circuit (DLY) 324<2>. The multiplexer 324<1> may output second shifting commands SF2<1:L> when the comparison signal CMP is disabled. The multiplexer 324<1> may output the first to L-th input commands IN_CMD<1:L> when the comparison signal CMP is enabled. In this case, the first to L-th input commands IN_CMD<1:L> may be set as a logic level combination for performing one of a read operation RD, a write operation WT, and a precharge operation PCG. When the command end signal CEND is enabled, the delay circuit 324<2> may output an output signal of the multiplexer 324<1> as the first to L-th pre-commands PCMD<1:L> by delaying the output signal by the amount of delay. The amount of delay of the delay circuit 324<2> may be variously set in different embodiments.

When the command end signal CEND is enabled, the command output circuit 325 may generate the first to L-th commands CMD<1:L> based on the first to L-th pre-commands PCMD<1:L>. When the command end signal CEND is enabled, the command output circuit 325 may output the first to L-th pre-commands PCMD<1:L> as the first to L-th commands CMD<1:L>.

The command generation circuit 232b, illustrated in FIG. 9, may be implemented to consecutively (RHC) perform a tracking read operation and a tracking write operation after performing the active operation ACT and to perform one of the read operation RD, the write operation WT, and the precharge operation PCG after consecutively (RHC) performing the tracking read operation and the tracking write operation. It is preferred that an operation of consecutively (RHC) the tracking read operation and the tracking write operation is performed before the precharge operation PCG is performed.

The amount of delay of each of the delay circuits 322<2>, 323<2>, and 324<2>, illustrated in FIG. 9, may be set as the amount of delay illustrated in FIG. 16.

Figure 10:
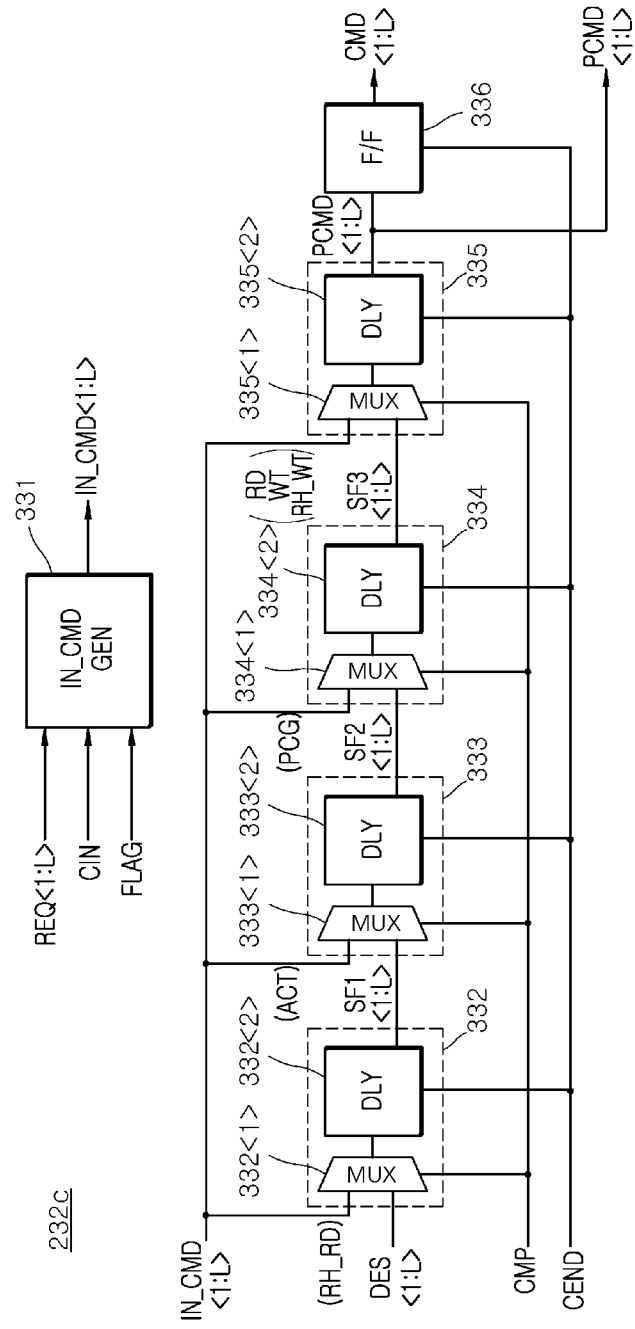

FIG. 10 illustrates a block diagram according to another embodiment of a command generation circuit 232c. As illustrated in FIG. 10, the command generation circuit 232c may include an input command generation circuit (IN_CMD GEN) 331, a first command shifting circuit 332, a second command shifting circuit 333, a third command shifting circuit 334, a fourth command shifting circuit 335, and a command output circuit (F/F) 336.

When the command input signal CIN is enabled, the input command generation circuit 331 may generate the first to L-th input commands IN_CMD<1:L> based on the first to L-th request signals REQ<1:L>. When the command input signal CIN is enabled, the input command generation circuit 331 may output the first to L-th request signals REQ<1:L> as the first to L-th input commands IN_CMD<1:L>. When the flag signal FLAG is disabled, the input command generation circuit 331 may block the input of the first to L-th request signals REQ<1:L> for performing a tracking write operation RH_WT.

The first command shifting circuit 332 may be implemented as a multiplexer (MUX) 332<1> and a delay circuit (DLY) 332<2>. The multiplexer 332<1> may output first to L-th deselection signals DES<1:L> when the comparison signal CMP is disabled. The multiplexer 332<1> may output the first to L-th input commands IN_CMD<1:L> when the comparison signal CMP is enabled. In this case, the first to L-th input commands IN_CMD<1:L> may be set as a logic level combination for performing a tracking read operation RH_RD. When the command end signal CEND is enabled, the delay circuit 332<2> may output an output signal of the multiplexer 332<1> as first shifting commands SF1<1:L> by delaying the output signal by the amount of delay. The amount of delay of the delay circuit 332<2> may be variously set in different embodiments. The first to L-th deselection signals DES<1:L> may be set as an operation of not selecting the first to fourth banks BK1 to BK4, illustrated in FIGS. 11 and 12.

The second command shifting circuit 333 may be implemented as a multiplexer (MUX) 333<1> and a delay circuit (DLY) 333<2>. The multiplexer 333<1> may output the first shifting commands SF1<1:L> when the comparison signal CMP is disabled. The multiplexer 333<1> may output the first to L-th input commands IN_CMD<1:L> when the comparison signal CMP is enabled. In this case, the first to L-th input commands IN_CMD<1:L> may be set as a logic level combination for performing an active operation ACT. When the command end signal CEND is enabled, the delay circuit 333<2> may output an output signal of the multiplexer 333<1> as second shifting commands SF2<1:L> by delaying the output signal by the amount of delay. The amount of delay of the delay circuit 333<2> may be variously set in different embodiments. The third command shifting circuit 334 may be implemented as a multiplexer (MUX) 334<1> and a delay circuit (DLY) 334<2>. The multiplexer 334<1> may output the second shifting commands SF2<1:L> when the comparison signal CMP is disabled. The multiplexer 334<1> may output the first to L-th input commands IN_CMD<1:L> when the comparison signal CMP is enabled. In this case, the first to L-th input commands IN_CMD<1:L> may be set as a logic level combination for performing a precharge operation PCG. When the command end signal CEND is enabled, the delay circuit 334<2> may output an output signal of the multiplexer 334<1> as third shifting commands SF3<1:L> by delaying the output signal by the amount of delay. The amount of delay of the delay circuit 334<2> may be variously set in different embodiments.

The fourth command shifting circuit 335 may be implemented as a multiplexer (MUX) 335<1> and a delay circuit (DLY) 335<2>. The multiplexer 335<1> may output the third shifting commands SF3<1:L> when the comparison signal CMP is disabled. The multiplexer 335<1> may output the first to L-th input commands IN_CMD<1:L> when the comparison signal CMP is enabled. In this case, the first to L-th input commands IN_CMD<1:L> may be set as a logic level combination for performing one of a read operation RD, a write operation WT, and a tracking read operation RH_WT. When the command end signal CEND is enabled, the delay circuit 335<2> may output an output signal of the multiplexer 335<1> as the first to L-th pre-commands PCMD<1:L> by delaying the output signal by the amount of delay. The amount of delay of the delay circuit 335<2> may be variously set in different embodiments.

When the command end signal CEND is enabled, the command output circuit 336 may generate the first to L-th commands CMD<1:L> based on the first to L-th pre-commands PCMD<1:L>. When the command end signal CEND is enabled, the command output circuit 336 may output the first to L-th pre-commands PCMD<1:L> as the first to L-th commands CMD<1:L>.

The command generation circuit 232c, illustrated in FIG. may be implemented to perform the active operation ACT after performing the tracking read operation RH_RD, to perform the precharge operation PCG after performing the active operation ACT, and to perform one of the read operation RD, the write operation WT, and the tracking write operation RH_WT after performing the precharge operation PCG.

The amount of delay of each of the delay circuits 332<2>, 333<2>, 334<2>, and 335<2>, illustrated in FIG. 10, may be set as the amount of delay, illustrated in FIG. 16.

Figure 11:
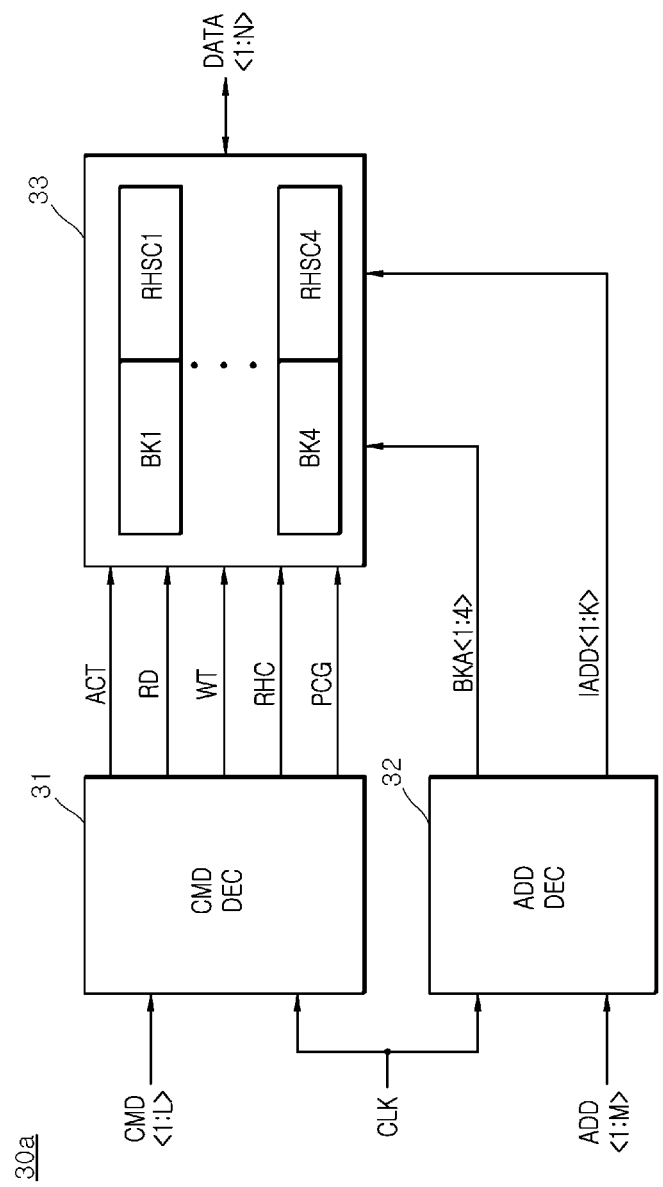
FIGS. 11 and 12 are block diagrams illustrating a construction according to an embodiment of a semiconductor device included in the semiconductor system, illustrated in FIG. 1.

FIG. 11 illustrates a block diagram according to an embodiment of a semiconductor device 30a. As illustrated in FIG. 11, the semiconductor device 30a may include a command decoder (CMD DEC) 31, an address decoder (ADD DEC) 32, and a memory circuit 33.

The command decoder 31 may generate an active signal ACT, a read signal RD, a write signal WT, a row hammering control signal RHC, and a precharge signal PCG, based on the first to L-th commands CMD<1:L>, in synchronization with a clock CLK. The command decoder 31 may generate the active signal ACT, the read signal RD, the write signal WT, the row hammering control signal RHC, and the precharge signal PCG that are selectively enabled by decoding the first to L-th commands CMD<1:L> in synchronization with the clock CLK. The command decoder 31 may generate the active signal ACT that is enabled when the first to L-th commands CMD<1:L> have a logic level combination for performing an active operation. The command decoder 31 may generate the read signal RD that is enabled when the first to L-th commands CMD<1:L> have a logic level combination for performing a read operation. The command decoder 31 may generate the write signal WT that is enabled when the first to L-th commands CMD<1:L> have a logic level combination for performing a write operation. The command decoder 31 may generate the row hammering control signal RHC that is enabled when the first to L-th commands CMD<1:L> have a logic level combination for performing a row hammering tracking operation. The command decoder 31 may generate the precharge signal PCG that is enabled when the first to L-th commands CMD<1:L> have a logic level combination for performing a precharge operation. The clock CLK may be set as a signal that is periodically toggled in order to synchronize operations of the host 10, the controller 20, and the semiconductor device 30a.

The address decoder 32 may generate first to fourth bank addresses BKA<1:4> and first to K-th internal addresses IADD<1:K>, based on the first to M-th addresses ADD<1:M>, in synchronization with the clock CLK. The address decoder 32 may generate the first to fourth bank addresses BKA<1:4> and the first to K-th internal addresses IADD<1:K> by decoding the first to M-th addresses ADD<1:M> in synchronization with the clock CLK. The first to fourth bank addresses BKA<1:4> may be set as an address for activating the first to fourth banks BK1 to BK4 and first to fourth row hammering storage circuits RHSC1 to RHSC4 that are included in the memory circuit 33. The first to K-th internal addresses IADD<1:K> may be set as the row address ROW ADD for activating a row path and the column address COL ADD for activating a column path, which are included in each of an activated bank, among the first to fourth banks BK1 to BK4, and an activated row hammering storage circuit, among the first to fourth row hammering storage circuits RHSC1 to RHSC4. The "K" number of bits of each of the first to K-th internal addresses IADD<1:K> may be variously set in different embodiments. "K" may be a natural number.

The memory circuit 33 may include the first to fourth banks BK1 to BK4 and the first to fourth row hammering storage circuits RHSC1 to RHSC4.

When the active signal ACT is enabled and the first bank address BKA<1> is enabled, the first bank BK1 may perform an active operation on a row path that is activated by the first to K-th internal addresses IADD<1:K>. When the read signal RD is enabled and the first bank address BKA<1> is enabled, the first bank BK1 may output first to N-th data DATA<1:N> that are stored in a memory cell (not illustrated) that is selected by a row path and a column path that is activated by the first to K-th internal addresses IADD<1:K>. When the write signal WT is enabled and the first bank address BKA<1> is enabled, the first bank BK1 may store the first to N-th data DATA<1:N> in a memory cell (not illustrated) that is selected by a row path and a column path that are activated by the first to K-th internal addresses IADD<1:K>. When the precharge signal PCG is enabled and the first bank address BKA<1> is enabled, the first bank BK1 may perform a precharge operation on a memory cell (not illustrated) that is selected by a row path and a column path that are activated by the first to K-th internal addresses IADD<1:K>.

The second to fourth banks BK2 to BK4 may be activated by only the second to fourth bank addresses BKA<2:4> and may perform the same operation as the first bank BK1, and thus, detailed descriptions thereof are omitted.

The first row hammering storage circuit RHSC1 may perform a row hammering tracking operation when the row hammering control signal RHC is enabled and the first bank address BKA<1> is enabled. The first row hammering storage circuit RHSC1 may output the active number of a first bank BK1 when the row hammering control signal RHC is enabled and the first bank address BKA<1> is enabled after the start of a tracking read operation of the row hammering tracking operation and may up-count the output active number of the first bank BK1 once. The first row hammering storage circuit RHSC1 may store the active number of the first bank BK1 that has been up-counted once after the start of a tracking write operation of the row hammering tracking operation.

The second to fourth row hammering storage circuits RHSC2 to RHSC4 may be activated by only the second to fourth bank addresses BKA<2:4> and may perform the same operation as the first row hammering storage circuit RHSC1, and thus, detailed descriptions thereof are omitted.

If the active number of the first bank BK1 that is stored in the first row hammering storage circuit RHSC1 is most counted, a smart refresh operation may be performed on the first bank BK1. The smart refresh operation for the first bank BK1 may be set as an operation of consecutively performing a refresh operation on a word line adjacent to a word line, that is, a row path that is most activated.

Figure 12:
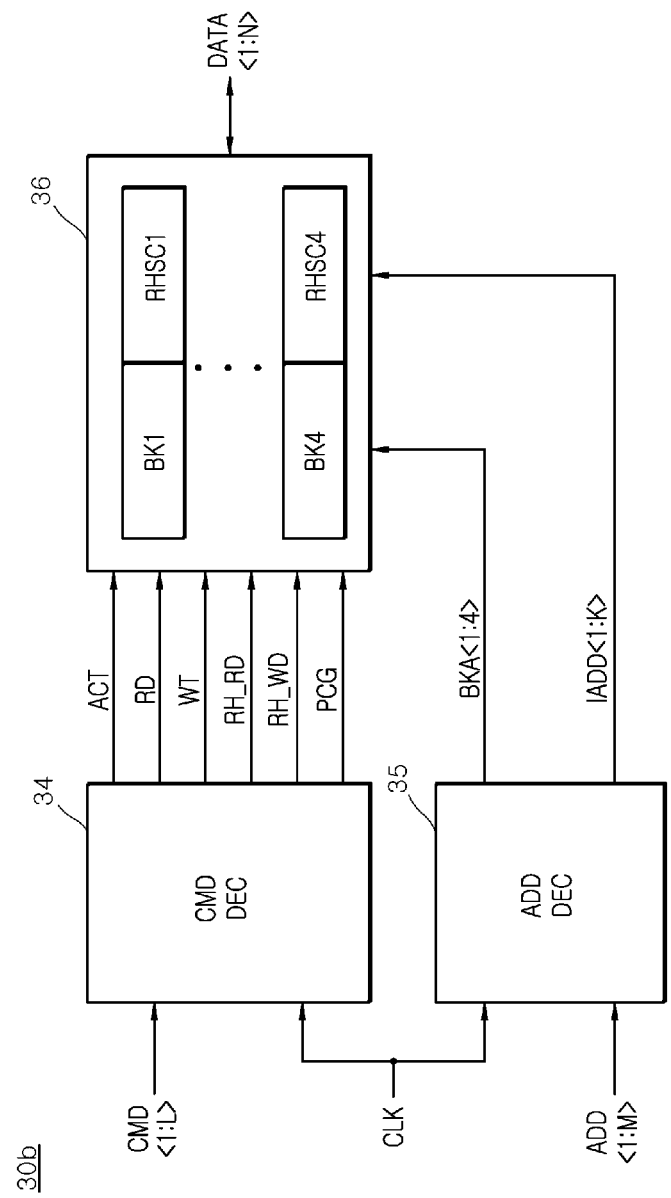

FIG. 12 illustrates a block diagram according to another embodiment of a semiconductor device 30b. As illustrated in FIG. 12, the semiconductor device 30b may include a command decoder (CMD DEC) 34, an address decoder (ADD DEC) 35, and a memory circuit 36.

The command decoder 34 may generate an active signal ACT, a read signal RD, a write signal WT, a row hammering read signal RH_RD, a row hammering write signal RH_WT, and a precharge signal PCG, based on the first to L-th commands CMD<1:L>, in synchronization with a clock CLK. The command decoder 34 may generate the active signal ACT, the read signal RD, the write signal WT, the row hammering read signal RH_RD, the row hammering write signal RH_WT, and the precharge signal PCG that are selectively enabled by decoding the first to L-th commands CMD<1:L> in synchronization with the clock CLK. The command decoder 34 may generate the active signal ACT that is enabled when the first to L-th commands CMD<1:L> have a logic level combination for performing an active operation. The command decoder 34 may generate the read signal RD that is enabled when the first to L-th commands CMD<1:L> have a logic level combination for performing a read operation. The command decoder 34 may generate the write signal WT that is enabled when the first to L-th commands CMD<1:L> have a logic level combination for performing a write operation. The command decoder 34 may generate the row hammering read signal RH_RD that is enabled when the first to L-th commands CMD<1:L> have a logic level combination for performing a tracking read operation of a row hammering tracking operation. The command decoder 34 may generate the row hammering write signal RH_WT that is enabled when the first to L-th commands CMD<1:L> have a logic level combination for performing a tracking write operation of the row hammering tracking operation. The command decoder 34 may generate the precharge signal PCG that is enabled when the first to L-th commands CMD<1:L> have a logic level combination for performing a precharge operation. The clock CLK may be set as a signal that is periodically toggled in order to synchronize operations of the host 10, the controller 20, and the semiconductor device 30b.

The address decoder 35 may generate first to fourth bank addresses BKA<1:4> and first to K-th internal addresses IADD<1:K>, based on the first to M-th addresses ADD<1:M>, in synchronization with the clock CLK. The address decoder 35 may generate the first to fourth bank addresses BKA<1:4> and the first to K-th internal addresses IADD<1:K> by decoding the first to M-th addresses ADD<1:M> in synchronization with the clock CLK. The first to fourth bank addresses BKA<1:4> may be set as an address for activating first to fourth banks BK1 to BK4 and first to fourth row hammering storage circuits RHSC1 to RHSC4 that are included in the memory circuit 36. The first to K-th internal addresses IADD<1:K> may be set as the row address ROW ADD for activating a row path and the column address COL ADD for activating a column path, which are included in each of an activated bank, among the first to fourth banks BK1 to BK4, and an activated row hammering storage circuit, among the first to fourth row hammering storage circuits RHSC1 to RHSC4. The "K" number of bits of the first to K-th internal addresses IADD<1:K> may be variously set in different embodiments. "K" may be a natural number.

The memory circuit 36 may include the first to fourth banks BK1 to BK4 and the first to fourth row hammering storage circuits RHSC1 to RHSC4.

When the active signal ACT is enabled and the first bank address BKA<1> is enabled, the first bank BK1 may perform an active operation on a row path that is activated by the first to K-th internal addresses IADD<1:K>. When the read signal RD is enabled and the first bank address BKA<1> is enabled, the first bank BK1 may output first to N-th data DATA<1:N> that are stored in a memory cell (not illustrated) that is selected by a row path and a column path that are activated by the first to K-th internal addresses IADD<1:K>. When the write signal WT is enabled and the first bank address BKA<1> is enabled, the first bank BK1 may store the first to N-th data DATA<1:N> in a memory cell (not illustrated) that is selected by a row path and a column path that are activated by the first to K-th internal addresses IADD<1:K>. When the precharge signal PCG is enabled and the first bank address BKA<1> is enabled, the first bank BK1 may perform a precharge operation on a memory cell (not illustrated) that is selected by a row path and a column path that are activated by the first to K-th internal addresses IADD<1:K>.

The second to fourth banks BK2 to BK4 may be activated by only the second to fourth bank addresses BKA<2:4> and may perform the same operation as the first bank BK1, and thus, detailed descriptions thereof are omitted.

The first row hammering storage circuit RHSC1 may perform a tracking read operation of a row hammering tracking operation when the row hammering read signal RH_RD is enabled and the first bank address BKA<1> is enabled. The first row hammering storage circuit RHSC1 may output the active number of the first bank BK1 when the row hammering read signal RH_RD is enabled and the first bank address BKA<1> is enabled after the start of the tracking read operation and may up-count the output active number of the first bank BK1 once. The first row hammering storage circuit RHSC1 may perform a tracking write operation of the row hammering tracking operation when the row hammering write signal RH_WT is enabled and the first bank address BKA<1> is enabled. The first row hammering storage circuit RHSC1 may store the active number of the first bank BK1 that has been up-counted once after the start of the tracking write operation.

The second to fourth row hammering storage circuits RHSC2 to RHSC4 may be activated by only the second to fourth bank addresses BKA<2:4> and may perform the same operation as the first row hammering storage circuit RHSC1, and thus, detailed descriptions thereof are omitted.

If the active number of the first bank BK1 that is stored in the first row hammering storage circuit RHSC1 is most counted, a smart refresh operation may be performed on the first bank BK1. The smart refresh operation for the first bank BK1 may be set as an operation of consecutively performing a refresh operation on a word line that is adjacent to a word line, that is, a row path that is most activated.

Figure 13:
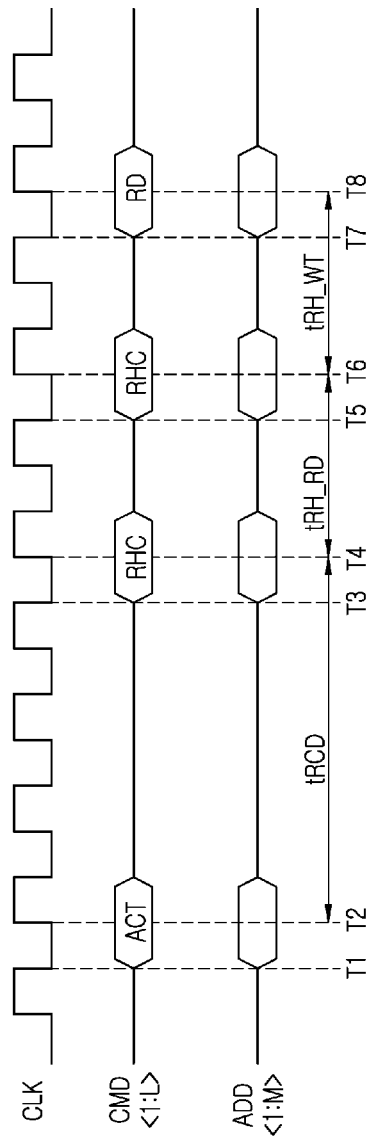
FIGS. 13 and 14 are timing diagrams for describing an operation of the semiconductor system according to an embodiment of the present disclosure.

An operation of consecutively performing an active operation, a row hammering tracking operation, and a read operation on the first bank BK1 according to an embodiment of the present disclosure is described as follows with reference to FIG. 13.

At timing T1, the controller 20 may receive, from the host 10, the first to L-th request signals REQ<1:L> and the first to M-th external addresses EADD<1:M> for performing an active operation ACT. The bank control circuit 230 may generate the first to L-th commands CMD<1:L> and the first to M-th addresses ADD<1:M> for performing the active operation ACT.

At timing T2, the semiconductor device 30 may perform the active operation on the first bank BK1, based on the first to L-th commands CMD<1:L> and the first to M-th addresses ADD<1:M>, in synchronization with the clock CLK.

At timing T3, the controller 20 may receive, from the host 10, the first to L-th request signals REQ<1:L> and the first to M-th external addresses EADD<1:M> for performing a row hammering tracking operation RHC. The bank control circuit 230 may generate the first to L-th commands CMD<1:L> and the first to M-th addresses ADD<1:M> for performing the row hammering tracking operation RHC.

At timing T4, the semiconductor device 30 may perform a tracking read operation of the row hammering tracking operation RHC on the first row hammering storage circuit RHSC1, based on the first to L-th commands CMD<1:L> and the first to M-th addresses ADD<1:M>, in synchronization with the clock CLK. The first row hammering storage circuit RHSC1 may output the active number of the first bank BK1 by performing the tracking read operation of the row hammering tracking operation RHC and may up-count the active number of the first bank BK1 once.

The timing T2 to the timing T4 may be set as an interval tRCD. The interval tRCD may mean RAS to CAS delay. The interval tRCD may be set as the time from the timing at which a row address is input to the timing at which a column address is input.

At timing T5, the controller 20 may receive, from the host 10, the first to L-th request signals REQ<1:L> and the first to M-th external addresses EADD<1:M> for performing a row hammering tracking operation RHC. The bank control circuit 230 may generate the first to L-th commands CMD<1:L> and the first to M-th addresses ADD<1:M> for performing the row hammering tracking operation RHC.

At timing T6, the semiconductor device 30 may perform a tracking write operation of the row hammering tracking operation RHC, based on the first to L-th commands CMD<1:L> and the first to M-th addresses ADD<1:M>, in synchronization with the clock CLK. The first row hammering storage circuit RHSC1 may perform the tracking write operation of the row hammering tracking operation RHC, and may store the active number of the first bank BK1 that has been up-counted once.

The timing T4 to the timing T6 may be set as an interval tRH_RD. The interval tRH_RD may be set as the time during which the active number of the first bank BK1 that is stored in the first row hammering storage circuit RHSC1 is output and the active number of the first bank BK1 is up-counted once.

At timing T7, the controller 20 may receive, from the host 10, the first to L-th request signals REQ<1:L> and the first to M-th external addresses EADD<1:M> for performing a read operation RD. The bank control circuit 230 may generate the first to L-th commands CMD<1:L> and the first to M-th addresses ADD<1:M> for performing the read operation RD.

At timing T8, the semiconductor device 30 may perform the read operation RD on the first bank BK1, based on the first to L-th commands CMD<1:L> and the first to M-th addresses ADD<1:M>, in synchronization with the clock CLK.

The timing T6 to the timing T8 may be set as an interval tRH_WT. The interval tRH_WT may be set as the time during which the active number of the first bank BK1 that has been up-counted once is stored in the first row hammering storage circuit RHSC1.

Such a semiconductor system 1, according to an embodiment of the present disclosure, can effectively reduce a failure that is attributable to a row hammering phenomenon by adjusting the timing at which a command for performing a normal operation and a row hammering tracking operation is generated.

Figure 14:
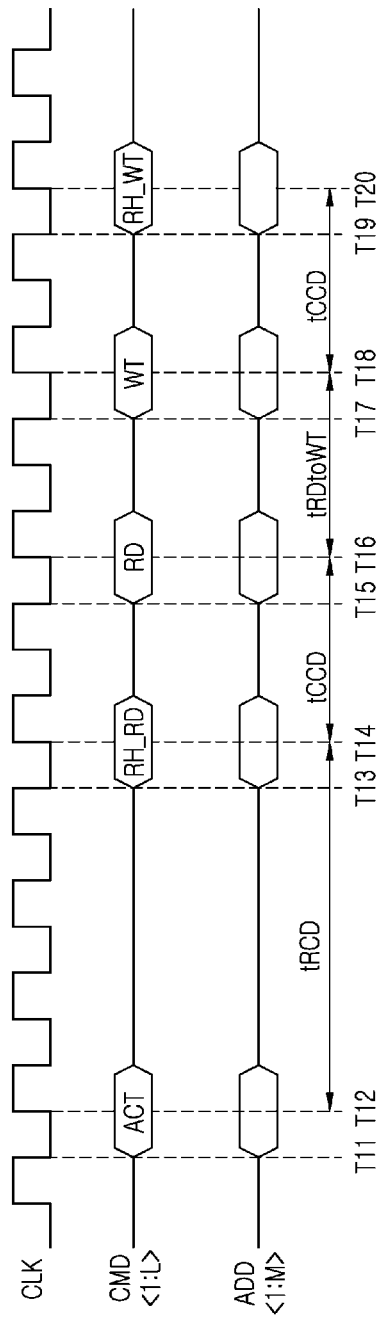

An operation of consecutively performing an active operation, a tracking read operation, a read operation, a write operation, and a tracking write operation on the first bank BK1 according to another embodiment of the present disclosure is described as follows with reference to FIG. 14.

At timing T11, the controller 20 may receive, from the host 10, the first to L-th request signals REQ<1:L> and the first to M-th external addresses EADD<1:M> for performing an active operation ACT. The bank control circuit 230 may generate the first to L-th commands CMD<1:L> and the first to M-th addresses ADD<1:M> for performing the active operation ACT.

At timing T12, the semiconductor device 30 may perform the active operation on the first bank BK1 based on the first to L-th commands CMD<1:L> and the first to M-th addresses ADD<1:M> in synchronization with the clock CLK.

At timing T13, the controller 20 may receive, from the host 10, the first to L-th request signals REQ<1:L> and the first to M-th external addresses EADD<1:M> for performing a tracking read operation RH_RD. The bank control circuit 230 may generate the first to L-th commands CMD<1:L> and the first to M-th addresses ADD<1: M> for performing the tracking read operation RH_RD.

At timing T14, the semiconductor device 30 may perform the tracking read operation RH_RD on the first row hammering storage circuit RHSC1 based on the first to L-th commands CMD<1:L> and the first to M-th addresses ADD<1:M> in synchronization with the clock CLK. The first row hammering storage circuit RHSC1 may output the active number of the first bank BK1 by performing the tracking read operation RH_RD and may up-count the active number of the first bank BK1 once.

The timing T12 to the timing T14 may be set as an interval tRCD. The interval tRCD may mean RAS to CAS delay. The interval tRCD may be set as the time from the timing at which a row address is input to the timing at which a column address is input.

At timing T15, the controller 20 may receive, from the host 10, the first to L-th request signals REQ<1:L> and the first to M-th external addresses EADD<1:M> for performing a read operation RD. The bank control circuit 230 may generate the first to L-th commands CMD<1:L> and the first to M-th addresses ADD<1:M> for performing the read operation RD.

At timing T16, the semiconductor device 30 may perform the read operation RD on the first bank BK1, based on the first to L-th commands CMD<1:L> and the first to M-th addresses ADD<1:M>, in synchronization with the clock CLK.

The timing T14 to the timing T16 may be set as an interval tCCD. The interval tCCD may mean CAS to CAS delay. The interval tCCD may be set as the time from the timing at which a first column address is input to the timing at which a second column address is input.

At timing T17, the controller 20 may receive, from the host 10, the first to L-th request signals REQ<1:L> and the first to M-th external addresses EADD<1:M> for performing a write operation WT. The bank control circuit 230 may generate the first to L-th commands CMD<1:L> and the first to M-th addresses ADD<1:M> for performing the write operation WT.

At timing T18, the semiconductor device 30 may perform the write operation WT on the first bank BK1, based on the first to L-th commands CMD<1:L> and the first to M-th addresses ADD<1:M>, in synchronization with the clock CLK.

The timing T16 to the timing T18 may be set as an interval tRD to WT. The interval tRD to WT may be set as the time up to the timing for performing the write operation after the read operation is performed.

At timing T19, the controller 20 may receive, from the host 10, the first to L-th request signals REQ<1:L> and the first to M-th external addresses EADD<1:M> for performing a tracking write operation RH_WT. The bank control circuit 230 may generate the first to L-th commands CMD<1:L> and the first to M-th addresses ADD<1:M> for performing the tracking write operation RH_WT.

At timing T20, the semiconductor device 30 may perform the tracking write operation RH_WT, based on the first to L-th commands CMD<1:L> and the first to M-th addresses ADD<1:M>, in synchronization with the clock CLK. The first row hammering storage circuit RHSC1 may perform the tracking write operation RH_WT and store the active number of the first bank BK1 that has been up-counted once.

The timing T18 to the timing T20 may be set as an interval tCCD. The interval tCCD may mean CAS to CAS delay. The interval tCCD may be set as the time from timing at which a first column address is input to timing at which a second column address is input.

Such a semiconductor system 1, according to another embodiment of the present disclosure, can reduce an unnecessary operation time for performing different operations by consecutively performing a read operation and a tracking read operation of a row hammering tracking operation, which are similar operations of outputting data that is stored therein, and consecutively performing a write operation and a tracking write operation of the row hammering tracking operation, which are similar operations of storing data therein.

Figure 15:
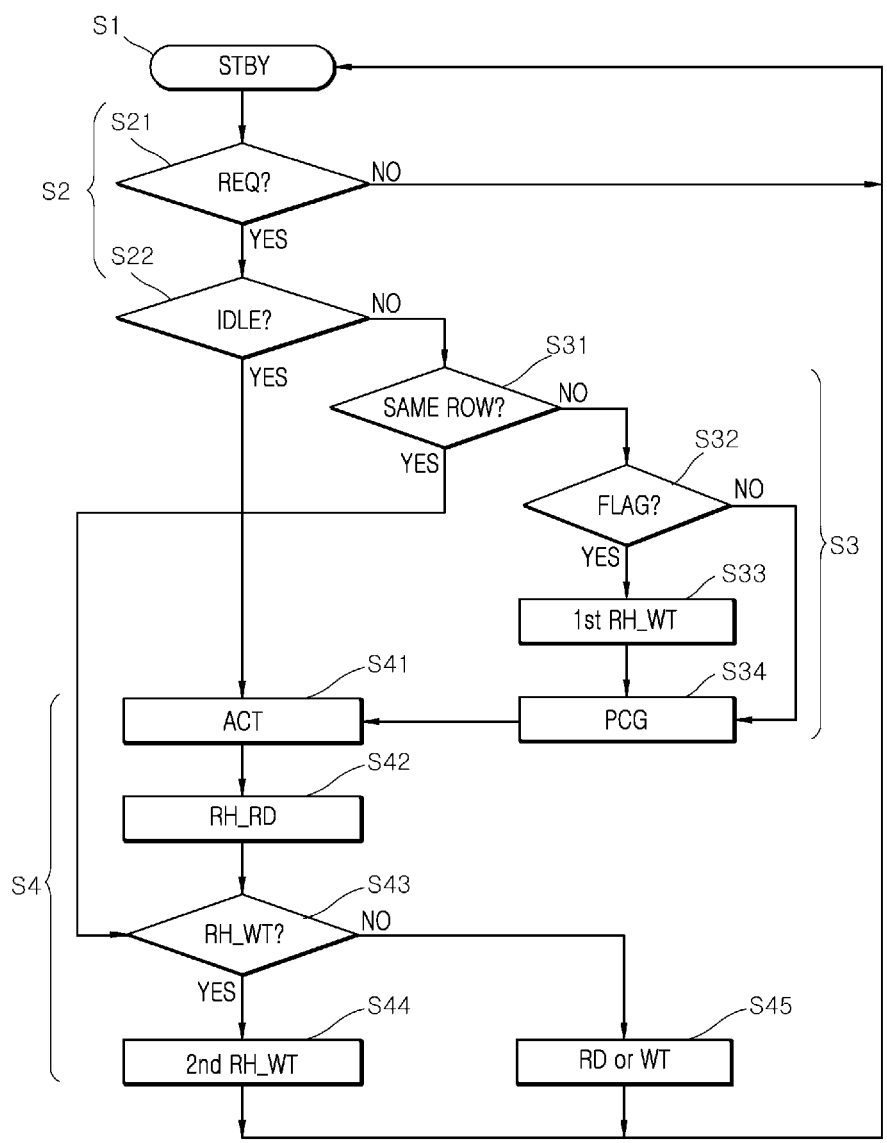
FIG. 15 is a flowchart for describing a row hammering tracking operation according to an embodiment of the present disclosure.

A row hammering tracking operation of the semiconductor system 1, according to an embodiment of the present disclosure, is described as follows with reference to FIG. 15.

The row hammering tracking operation may include a standby step S1, a request step S2, a bank detection step S3, and an operation execution step S4.

The standby step S1 may be set as a standby step for performing, by the semiconductor device 30, an operation. When the standby step S1 is terminated, the semiconductor device 30 may enter a request detection step S21.

The request step S2 may include the request detection step S21 and an idle detection step S22.

The request detection step S21 may be set as a step of outputting, by the host 10, the first to L-th request signals REQ<1: L> and the first to M-th external addresses EADD<1:M>.

The idle detection step S22 may be set as a step of detecting whether the semiconductor device 30 performs an active operation. If the semiconductor device 30 performs the active operation in the idle detection step S22 (NO), the semiconductor device 30 may enter the same bank detection step S31. If the semiconductor device 30 does not perform the active operation in the idle detection step S22 (YES), the semiconductor device 30 may enter an active operation step S41.

The bank detection step S3 may include the same bank detection step S31, a flag signal detection step S32, a first tracking write operation step S33, and a precharge step S34.

Based on the first to M-th external addresses EADD<1:M>, the same bank detection step S31 may be set as a step of detecting whether a bank BK on which the active operation is currently performed is identical with a bank BK on which the active operation is to be performed. When the bank BK on which the active operation is currently performed is identical with the bank BK on which the active operation is to be performed based on the first to M-th external addresses EADD<1:M> in the same bank detection step S31 (YES), the semiconductor device 30 may enter a tracking write operation detection step S43. When the bank BK on which the active operation is currently performed is different from the bank BK on which the active operation is to be performed based on the first to M-th external addresses EADD<1:M> in the same bank detection step S31 (NO), the semiconductor device 30 may enter the flag signal detection step S32.

The flag signal detection step S32 may be set as a step of detecting a logic level of the flag signal FLAG. When the flag signal FLAG is enabled in the flag signal detection step S32 (YES), the semiconductor device 30 may enter the first tracking write operation step S33. When the flag signal FLAG is disabled in the flag signal detection step S32 (NO), the semiconductor device 30 may enter the precharge step S34.

The first tracking write operation step S33 may be set as a step of performing a tracking write operation on the bank BK on which the active operation has been performed after performing the active operation on the bank BK that has been selected by the first to M-th external addresses EADD<1:M>. The row hammering storage circuit RHSC of the bank BK on which the active operation has been performed in the first tracking write operation step S33 may store the active number of the bank BK that has been up-counted once. When the first tracking write operation step S33 is terminated, the semiconductor device 30 may enter the precharge step S34.

The precharge step S34 may be set as a step of performing a precharge operation on the bank BK on which the tracking write operation has been performed. In the precharge step S34, when the flag signal FLAG is disabled (NO), the precharge operation may be performed on the bank BK that is selected by the first to M-th external addresses EADD<1:M> because the bank BK is a bank BK on which the tracking write operation has already been performed. In the precharge step S34, the precharge operation may be performed on the bank BK on which the tracking write operation has already been performed in the first tracking write operation step S33. When the precharge step S34 is terminated, the semiconductor device 30 may enter the active operation step S41.

The operation execution step S4 may include the active operation step S41, a tracking read operation step S42, the tracking write operation detection step S43, a second tracking write operation step S44, and a read operation and write operation step S45.

The active operation step S41 may be set as a step of performing an active operation on the bank BK that is selected by the first to L-th request signals REQ<1:L> and the first to M-th external addresses EADD<1:M>. When the active operation step S41 is terminated, the semiconductor device 30 may enter the tracking read operation step S42.

The tracking read operation step S42 may be set as a step of outputting the active number of the bank BK on which the active operation has been performed and once up-counting the active number of the bank BK on which the active operation has been performed. In the tracking read operation step S42, the row hammering storage circuit RHSC may output the active number of the bank BK on which the active operation has been performed and may up-count the active number of the bank BK once. When the tracking read operation step S42 is terminated, the semiconductor device 30 may enter the tracking write operation detection step S43.

The tracking write operation detection step S43 may be set as a step of detecting whether the first to L-th request signals REQ<1:L> have a logic level combination for performing a tracking write operation. When the first to L-th request signals REQ<1:L> have a logic level combination for performing the tracking write operation in the tracking write operation detection step S43 (YES), the semiconductor device 30 may enter the second tracking write operation step S44. When the first to L-th request signals REQ<1:L> does not have a logic level combination for performing the tracking write operation in the tracking write operation detection step S43 (NO), the semiconductor device 30 may enter the read operation and write operation step S45.

The second tracking write operation step S44 may be set as a step of performing a tracking write operation on the bank BK that is selected by the first to L-th request signals REQ<1:L> and the first to M-th external addresses EADD<1:M>. In the second tracking write operation step S44, the row hammering storage circuit RHSC of the bank BK on which the active operation has been performed based on the first to L-th request signals REQ<1:L> and the first to M-th external addresses EADD<1:M> may store the active number of the bank BK that has been up-counted once. When the second tracking write operation step S44 is terminated, the semiconductor device 30 may enter the standby step S1.

The read operation and write operation step S45 may be set as a step of performing a read operation and a write operation on the bank BK that is selected by the first to L-th request signals REQ<1:L> and the first to M-th external addresses EADD<1:M>. When the first to L-th request signals REQ<1:L> have a logic level combination for performing the read operation in the read operation and write operation step S45, the semiconductor device 30 may perform the read operation on the bank BK that is selected by the first to M-th external addresses EADD<1:M>. When the first to L-th request signals REQ<1:L> have a logic level combination for performing the write operation in the read operation and write operation step S45, the semiconductor device 30 may perform the write operation on the bank BK that is selected by the first to M-th external addresses EADD<1:M>. When the read operation and write operation step S45 is terminated, the semiconductor device 30 may enter the standby step S1.

According to an embodiment of the present disclosure, an efficient row hammering tracking operation can be performed by performing a tracking write operation when an active operation is consecutively performed on the same bank and by selectively performing a tracking write operation or a precharge operation by detecting whether a tracking write operation has been performed when active operations are consecutively performed on different banks.

FIG. 16 is a table illustrating the amount of delay by which a command of the semiconductor system 1 is generated according to an embodiment of the present disclosure.

First, the amount of delay by which a command is generated with respect to the same bank (SAME BANK) is described as follows.

A current status (BANK STATUS) may be an active operation (ACT). The amount of delay by which the first to L-th commands CMD<1:L> for performing a read operation (READ) or a write operation (WRITE) are input may be set as tRCD (RAS to CAS delay). tRCD (RAS to CAS delay) may be set as the time from the timing at which a row address is input to the timing at which a column address is input.

A current status (BANK STATUS) may be an active operation (ACT). The amount of delay by which the first to L-th commands CMD<1:L> for performing a precharge operation (PRECHARGE) are input may be set as tRAS (Pre charge time DELAY). tRAS (Pre charge time DELAY) may be set as the time from timing at which a command for performing the active operation is input to timing at which a command for performing the precharge operation is input.

A current status (BANK STATUS) may be a read operation (RD). The amount of delay by which the first to L-th commands CMD<1:L> for performing a read operation (READ) are input may be set as tCCD (CAS to CAS DELAY). tCCD (CAS to CAS DELAY) may be set as the timing from timing at which a first column address is input to timing at which a second column address is input.

A current status (BANK STATUS) may be a read operation (RD). The amount of delay by which the first to L-th commands CMD<1:L> for performing a write operation (WRITE) are input may be set as tRD to WT (Read to Write DELAY). tRD to WT (Read to Write DELAY) may be set as the time from timing at which a command for performing the read operation is input to timing at which a command for performing the write operation is input.

A current status (BANK STATUS) may be a read operation (RD). The amount of delay by which the first to L-th commands CMD<1:L> for performing a precharge operation (PRECHARGE) are input may be set as tRTP (Read to Precharge DELAY)+tRAS (Pre charge time DELAY). tRTP (Read to Precharge DELAY) may be set as the time from timing at which a command for performing the read operation is input to timing at which a command for performing the precharge operation is input.

A current status (BANK STATUS) may be a write operation (WT). The amount of delay by which the first to L-th commands CMD<1:L> for performing a read operation (READ) are input may be set as tWT to RD (Write to Read DELAY). tWT to RD (Write to Read DELAY) may be set as the time from timing at which a command for performing the write operation is input to timing at which a command for performing the read operation is input.

A current status (BANK STATUS) may be a write operation (WT). The amount of delay by which the first to L-th commands CMD<1:L> for performing the write operation (WRITE) are input may be set as tCCD (CAS to CAS DELAY).

A current status (BANK STATUS) may be a write operation (WT). The amount of delay by which the first to L-th commands CMD<1:L> for performing a precharge operation (PRECHARGE) are input may be set as tWR (Write Recovery DELAY)+tRAS (Pre charge time DELAY). tWR (Write Recovery DELAY) may be set as the time from timing at which the last data is input to timing at which a command for performing the precharge operation is input.

A current status (BANK STATUS) may be a tracking read operation (RH_RD). The amount of delay by which the first to L-th commands CMD<1:L> for performing a read operation (READ) are input may be set as tCCD (CAS to CAS DELAY).

A current status (BANK STATUS) may be a tracking read operation (RH_RD). The amount of delay by which the first to L-th commands CMD<1:L> for performing a write operation (WRITE) are input may be set as tRD to WT (Read to Write DELAY).

A current status (BANK STATUS) may be a tracking write operation (RH_WT). The amount of delay by which the first to L-th commands CMD<1:L> for performing a read operation (READ) are input may be set as tWT to RD (Write to Read DELAY).

A current status (BANK STATUS) may be a tracking write operation (RH_WT). The amount of delay by which the first to L-th commands CMD<1:L> for performing a write operation (WRITE) are input may be set as tCCD (CAS to CAS DELAY).

A current status (BANK STATUS) may be a tracking write operation (RH_WT). The amount of delay by which the first to L-th commands CMD<1:L> for performing a precharge operation (PRECHARGE) are input may be set as tWR (Write Recovery DELAY)+tRAS (Pre charge time DELAY).

Next, the amount of delay by which a command is generated with respect to a different bank (DIFFERENT BANK) is described as follows.

A current status (BANK STATUS) may be an active operation (ACT). The amount of delay by which the first to L-th commands CMD<1:L> for performing the active operation (ACTIVE) are input may be set as tRRD (RAS to RAS DELAY). tRRD (RAS to RAS DELAY) may be set as the time from timing at which a row address for activating any one bank is input to timing at which a row address for activating another bank is input.

A current status (BANK STATUS) may be an active operation (ACT). The amount of delay by which the first to L-th commands CMD<1:L> for performing one of a read operation (READ), a write operation (WRITE), and a precharge operation (PRECHARGE) are input may be set as "N" CLK. "N" CLK may be set as the time during which the clock CLK is toggled "N" times. "N" CLK may be set as various numbers of times that the clock CLK is toggled according to an embodiment.

A current status (BANK STATUS) may be a read operation (RD). The amount of delay by which the first to L-th commands CMD<1:L> for performing an active operation (ACTIVE) or a precharge operation (PRECHARGE) are input may be set as "N" CLK.

A current status (BANK STATUS) may be a read operation (RD). The amount of delay by which the first to L-th commands CMD<1:L> for performing a read operation (READ) are input may be set as tCCD (CAS to CAS DELAY).

A current status (BANK STATUS) may be a read operation (RD). The amount of delay by which the first to L-th commands CMD<1:L> for performing a write operation (WRITE) are input may be set as tRD to WT (Read to Write DELAY).

A current status (BANK STATUS) may be a write operation (WT). The amount of delay by which the first to L-th commands CMD<1:L> for performing an active operation (ACTIVE) or a precharge operation (PRECHARGE) are input may be set as "N" CLK.

A current status (BANK STATUS) may be a write operation (WT). The amount of delay by which the first to L-th commands CMD<1:L> for performing a read operation (READ) are input may be set as tWT to RD (Write to Read DELAY).

A current status (BANK STATUS) may be a write operation (WT). The amount of delay by which the first to L-th commands CMD<1:L> for performing a write operation (WRITE) are input may be set as tCCD (CAS to CAS DELAY).

A current status (BANK STATUS) may be a tracking read operation (RH_RD). The amount of delay by which the first to L-th commands CMD<1:L> for performing a read operation (READ) or a write operation (WRITE) are input may be set as "N" CLK.

A current status (BANK STATUS) may be a tracking write operation (RH_WT). The amount of delay by which the first to L-th commands CMD<1:L> for performing one of a read operation (READ), a write operation (WRITE), and a precharge operation (PRECHARGE) are input may be set as "N" CLK.

Figure 17:
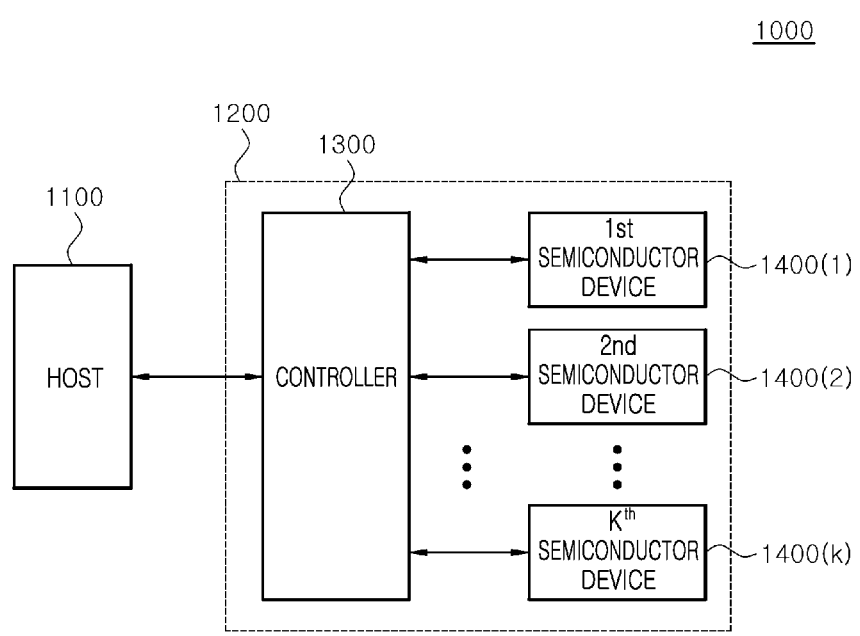
FIG. 17 is a diagram illustrating a construction according to an embodiment of an electronic system to which the semiconductor system, illustrated in FIGS. 1 to 16, has been applied.

FIG. 17 illustrates a block diagram according to an embodiment of an electronic system 1000 according to an embodiment of the present disclosure. As illustrated in FIG. 17, the electronic system 1000 may include a host 1100 and a semiconductor system 1200.

The host 1100 and the semiconductor system 1200 may mutually transmit signals by using an interface protocol. Examples of the interface protocol that is used in the host 1100 and the semiconductor system 1200 may include a multi-media card (MMC), an enhanced small disk interface (ESDI), integrated drive electronics (IDE), a peripheral component interconnect-express (PCI-E), advanced technology attachment (ATA), serial ATA (SATA), parallel ATA (PATA), a serial attached SCSI (SAS), a universal serial bus (USB), etc.

The semiconductor system 1200 may include a controller 1300 and semiconductor devices 1400(K:1). The controller 1300 may control the semiconductor devices 1400(K:1) so that the semiconductor devices 1400(K:1) perform an active operation, a write operation, a read operation, a row hammering tracking operation, a precharge operation, etc. The controller 1300 may adjust timing at which a command for performing a normal operation and a row hammering tracking operation is generated, so that a failure attributable to a row hammering phenomenon can be effectively reduced. Each of the semiconductor devices 1400(K:1) can reduce an unnecessary operation time for performing different operations by consecutively performing a read operation and a tracking read operation of a row hammering tracking operation, which are similar operations of outputting data that is stored therein, and by consecutively performing a write operation and a tracking write operation of the row hammering tracking operation, which are similar operations of storing data therein. Each of the semiconductor devices 1400(K:1) can perform an efficient row hammering tracking operation by performing a tracking write operation when an active operation is consecutively performed on the same bank and by selectively performing a tracking write operation or a precharge operation by detecting whether a tracking write operation has been performed when active operations are consecutively performed on different banks. Each of the semiconductor devices 1400(K:1) may perform an active operation, a write operation, a read operation, a row hammering tracking operation, a precharge operation, etc.

The host 1100 may be implemented as the host 10 illustrated in FIG. 1. The controller 1300 may be implemented as the controller 20 illustrated in FIG. 1. Each of the semiconductor devices 1400(K:1) may be implemented as the semiconductor device 30 illustrated in FIG. 1. According to an embodiment, the semiconductor devices 1400(K:1) may be implemented as one of dynamic random access memory (DRAM), phase change random access memory (PRAM), resistive random access memory (PRAM), magnetic random access memory (MRAM), and ferroelectric random access memory (FRAM).

What is claimed is:

1. A semiconductor system comprising:
 a controller configured to generate a command and an address for performing a row hammering tracking operation and for performing a precharge operation on a bank on which a tracking write operation of the row hammering tracking operation has been completed; and
 a semiconductor device comprising the bank and a row hammering storage circuit, the semiconductor device configured to:
  count an active number of the bank that is stored in the row hammering storage circuit by performing a tracking read operation of the row hammering tracking operation based on the command and the address, then store, in the row hammering circuit, an active number of the bank that is counted by performing the tracking write operation of the row hammering tracking operation, and perform the precharge operation on the bank based on the command.

2. The semiconductor system of claim 1, wherein the controller is configured to:

generate the command and the address for performing the tracking write operation by detecting a time at which the tracking write operation is not performed on the bank, and then generate the command and the address for performing the precharge operation.

3. The semiconductor system of claim 1, wherein the controller comprises:

a queuing circuit configured to:

store an external address for performing the tracking write operation as a write address, store an external address for performing the tracking read operation as a read address, and output one of the stored write address and the stored read address as a selection address based on a write read selection signal; and the bank control circuit configured to:

generate, from a request signal, the command for performing the tracking read operation, the tracking write operation, and the precharge operation based on a flag signal that is disabled when the tracking write operation is performed, and generate the address from the selection address.

4. The semiconductor system of claim 3, wherein the queuing circuit comprises:

a write queuing circuit configured to store the external address and generate a write selection address from the stored external address;

a read queuing circuit configured to store the external address and generate a read selection address from the stored external address; and an address selection circuit configured to output one of the write selection address and the read selection address as the selection address based on the write read selection signal.

5. The semiconductor system of claim 3, wherein the bank control circuit comprises:

a comparison circuit configured to generate a comparison signal that is input when a row address, among the selection addresses, is identically input;

a command generation circuit configured to generate the command by delaying the request signal based on the flag signal, a command input signal, a command end signal, and the comparison signal;

a standby signal generation circuit configured to generate an enabled standby signal when the command input signal is repeatedly input when the comparison signal is enabled and configured to generate a disabled standby signal when the command end signal is input;

a command end signal generation circuit configured to generate the command end signal that is enabled when a pre-command is input and that is disabled when the command is output; and an address generation circuit configured to generate the address based on the selection address.

6. The semiconductor system of claim 5, wherein the command generation circuit comprises:

an input command generation circuit configured to generate an input command based on the request signal when the command input signal is enabled and configured to block the input of the request signal for performing the tracking write operation when the flag signal is disabled;

a first command shifting circuit configured to generate a first shifting command by shifting the input command for consecutively performing the tracking read operation and the tracking write operation when the comparison signal and the command end signal are enabled;

a second command shifting circuit configured to generate a second shifting command by shifting the input command for performing an active operation when the comparison signal and the command end signal are enabled and configured to generate the second shifting command by shifting the first shifting command when the comparison signal is disabled and the command end signal is enabled;

a third command shifting circuit configured to generate a pre-command by shifting the input command for performing the precharge operation when the comparison signal and the command end signal are enabled and configured to generate the pre-command by shifting the second shifting command when the comparison signal is disabled and the command end signal is enabled; and a command output circuit configured to generate the command based on the pre-command when the command end signal is enabled.

7. The semiconductor system of claim 5, wherein the command generation circuit comprises:

an input command generation circuit configured to generate an input command based on the request signal when the command input signal is enabled and configured to block the input of the request signal for performing the tracking write operation when the flag signal is disabled;

a first command shifting circuit configured to generate a first shifting command by shifting the input command for performing an active operation when the comparison signal and the command end signal are enabled;

a second command shifting circuit configured to generate a second shifting command by shifting the input command for consecutively performing the tracking read operation and the tracking write operation when the comparison signal and the command end signal are enabled and configured to generate the second shifting command by shifting the first shifting command when the comparison signal is disabled and the command end signal is enabled;

a third command shifting circuit configured to generate a pre-command by shifting the input command for performing the precharge operation when the comparison signal and the command end signal are enabled and configured to generate the pre-command by shifting the second shifting command when the comparison signal is disabled and the command end signal is enabled; and a command output circuit configured to generate the command based on the pre-command when the command end signal is enabled.

8. The semiconductor system of claim 5, wherein the command generation circuit comprises:

an input command generation circuit configured to generate an input command based on the request signal when the command input signal is enabled and configured to block the input of the request signal for performing the tracking write operation when the flag signal is disabled;

a first command shifting circuit configured to generate a first shifting command by shifting the input command for performing the tracking read operation when the comparison signal and the command end signal are enabled;

a second command shifting circuit configured to generate a second shifting command by shifting the input command for performing an active operation when the comparison signal and the command end signal are enabled and configured to generate the second shifting command by shifting the first shifting command when the comparison signal is disabled and the command end signal is enabled;

a third command shifting circuit configured to generate a third shifting command by shifting the input command for performing the precharge operation when the comparison signal and the command end signal are enabled and configured to generate the third shifting command by shifting the second shifting command when the comparison signal is disabled and the command end signal is enabled;

a fourth command shifting circuit configured to generate a pre-command by shifting the input command for performing the tracking write operation when the comparison signal and the command end signal are enabled and configured to generate the pre-command by shifting the third shifting command when the comparison signal is disabled and the command end signal is enabled; and a command output circuit configured to generate the command based on the pre-command when the command end signal is enabled.

9. The semiconductor system of claim 3, wherein the controller further comprises:

a schedule control circuit configured to generate the write read selection signal that is enabled when the tracking write operation is performed based on the request signal; and a flag signal generation circuit configured to generate the flag signal that is disabled when the command for performing the tracking write operation is input and the tracking write operation is completed and configured to generate the flag signal that is enabled when the command for performing the tracking read operation is input.

10. A semiconductor system comprising:

a controller configured to output a command and an address for performing a row hammering tracking operation and for performing a read operation and a write operation; and a semiconductor device comprising a bank and a row hammering storage circuit, the semiconductor device configured to:

count an active number of the bank that is stored in the row hammering storage circuit by performing the row hammering tracking operation based on the command and the address, store the counted active number in the row hammering storage circuit, configured to output data that is stored in the bank by performing the read operation based on the command and the address, and store the data in the bank by performing the write operation based on the command and the address.

11. The semiconductor system of claim 10, wherein:

the controller is configured to output the command and the address for performing the read operation after generating the command and the address for performing a tracking read operation of the row hammering tracking operation, and the controller is configured to output the command and the address for performing a tracking write operation of the row hammering tracking operation after generating the command and the address for performing the write operation.

12. The semiconductor system of claim 10, wherein the controller comprises:

a queuing circuit configured to:

store external addresses for performing a tracking write operation and the write operation as first and second write addresses, store external addresses for performing a tracking read operation and the read operation as first and second read addresses, and output one of the stored first and second write addresses and the stored first and second read addresses as a selection address based on a write read selection signal; and a bank control circuit configured to:

generate, from a request signal, the command for performing an active operation, the tracking read operation, the read operation, the tracking write operation, and the write operation based on a flag signal that is disabled when the tracking write operation is performed, and generate the address from the selection address.

13. The semiconductor system of claim 12, wherein the queuing circuit comprises:

a write queuing circuit configured to sequentially store the external addresses and generate a write selection address from one of the sequentially stored external addresses;

a read queuing circuit configured to sequentially store the external addresses and generate a read selection address from one of the sequentially stored external addresses; and an address selection circuit configured to output one of the write selection address and the read selection address as the selection address based on the write read selection signal.

14. The semiconductor system of claim 13, wherein the write queuing circuit comprises:

a first write queuing circuit configured to store the external address as a first write address and configured to output the first write address;

a second write queuing circuit configured to store the external address as a second write address and configured to output the second write address;

a write selection signal generation circuit configured to generate a first write selection signal and a second write selection signal that are selectively enabled based on operation sequence information that is included in the external address; and a write selection transfer circuit configured to output one of the first write address and the second write address as the write selection address based on the first write selection signal and the second write selection signal.

15. The semiconductor system of claim 13, wherein the read queuing circuit comprises:

a first read queuing circuit configured to store the external address as a first read address and configured to output the first read address;

a second read queuing circuit configured to store the external address as a second read address and configured to output the second read address;

a read selection signal generation circuit configured to generate a first read selection signal and a second read selection signal that are selectively enabled based on operation sequence information that is included in the external address; and a read selection transfer circuit configured to output one of the first read address and the second read address as the read selection address based on the first read selection signal and the second read selection signal.

16. The semiconductor system of claim 12, wherein the bank control circuit comprises:

a comparison circuit configured to generate a comparison signal that is input when a row address among the selection addresses is identically input;

a command generation circuit configured to generate the command by delaying the request signal based on the flag signal, a command input signal, a command end signal, and the comparison signal;

a standby signal generation circuit configured to generate an enabled standby signal when the command input signal is repeatedly input when the comparison signal is enabled and configured to generate a disabled standby signal when the command end signal is input;

a command end signal generation circuit configured to generate the command end signal that is enabled when a pre-command is input and that is disabled when the command is output; and an address generation circuit configured to generate the address based on the selection address.

17. The semiconductor system of claim 16, wherein the command generation circuit comprises:

an input command generation circuit configured to generate an input command based on the request signal when the command input signal is enabled and configured to block the input of the request signal for performing the tracking write operation when the flag signal is disabled;

a first command shifting circuit configured to generate a first shifting command by shifting the input command for performing the tracking read operation when the comparison signal and the command end signal are enabled;

a second command shifting circuit configured to generate a second shifting command by shifting the input command for performing an active operation when the comparison signal and the command end signal are enabled and configured to generate the second shifting command by shifting the first shifting command when the comparison signal is disabled and the command end signal is enabled;

a third command shifting circuit configured to generate a third shifting command by shifting the input command for performing the precharge operation when the comparison signal and the command end signal are enabled and configured to generate the third shifting command by shifting the second shifting command when the comparison signal is disabled and the command end signal is enabled;

a fourth command shifting circuit configured to generate a pre-command by shifting the input command for performing the read operation, the write operation, and the tracking write operation when the comparison signal and the command end signal are enabled and configured to generate the pre-command by shifting the third shifting command when the comparison signal is disabled and the command end signal is enabled; and a command output circuit configured to generate the command based on the pre-command when the command end signal is enabled.

18. A semiconductor system comprising:

a controller configured to:
generate a command and an address for performing a row hammering tracking operation; and
generate the command and the address for performing a tracking write operation on a bank on which the tracking write operation of the row hammering tracking operation has not been performed based on a logic level of a flag signal when a row address that is included in the address does not have the same logic level combination or for performing a precharge operation on the bank on which the tracking write operation has been performed; and a semiconductor device including the bank and a row hammering storage circuit, the semiconductor device configured to:
store, in the row hammering circuit, an active number of the bank that is counted by performing the tracking write operation of the row hammering tracking operation; and
perform the precharge operation on the bank based on the command.

* * * * *